(12) United States Patent
Miyairi

(10) Patent No.: US 6,803,296 B2
(45) Date of Patent: Oct. 12, 2004

(54) METHOD OF MANUFACTURING A SEMICONDUCTOR DEVICE WITH LEVELING OF A SURFACE OF A SEMICONDUCTOR FILM THROUGH IRRADIATION

(75) Inventor: Hidekazu Miyairi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 21 days.

(21) Appl. No.: 10/157,233

(22) Filed: May 30, 2002

(65) Prior Publication Data

US 2002/0182785 A1 Dec. 5, 2002

(30) Foreign Application Priority Data

Jun. 1, 2001 (JP) ........................................ 2001-166642

(51) Int. Cl.⁷ .......................... H01L 21/20; H01L 21/36
(52) U.S. Cl. ........................ 438/486; 438/487; 438/509
(58) Field of Search .......................... 257/66, 347, 352, 257/353; 438/149, 150, 160, 166, 486, 487, 488, 502, 509

(56) References Cited

U.S. PATENT DOCUMENTS

| | | | |
|---|---|---|---|
| 5,693,541 A | 12/1997 | Yamazaki et al. | 438/486 |
| 6,225,197 B1 * | 5/2001 | Maekawa | 438/487 |
| 6,455,360 B1 * | 9/2002 | Miyasaka | 438/166 |
| 6,559,036 B1 * | 5/2003 | Ohtani et al. | 438/486 |
| 2001/0034088 A1 | 10/2001 | Nakamura et al. | 438/166 |

FOREIGN PATENT DOCUMENTS

| | | |
|---|---|---|
| JP | 8-78329 | 3/1996 |
| JP | 2001-60551 | 3/2001 |

* cited by examiner

Primary Examiner—Long Pham
Assistant Examiner—Hoai Pham
(74) Attorney, Agent, or Firm—Fish & Richardson P.C.

(57) ABSTRACT

To obtain a TFT, in which an off-current value is low and the fluctuation is suppressed, and an electronic equipment provided with the TFT. A film deposition temperature is set to substantially the same between a base insulating film and an amorphous semiconductor film to improve flatness of the semiconductor film. Then, laser light irradiation is conducted.

11 Claims, 25 Drawing Sheets

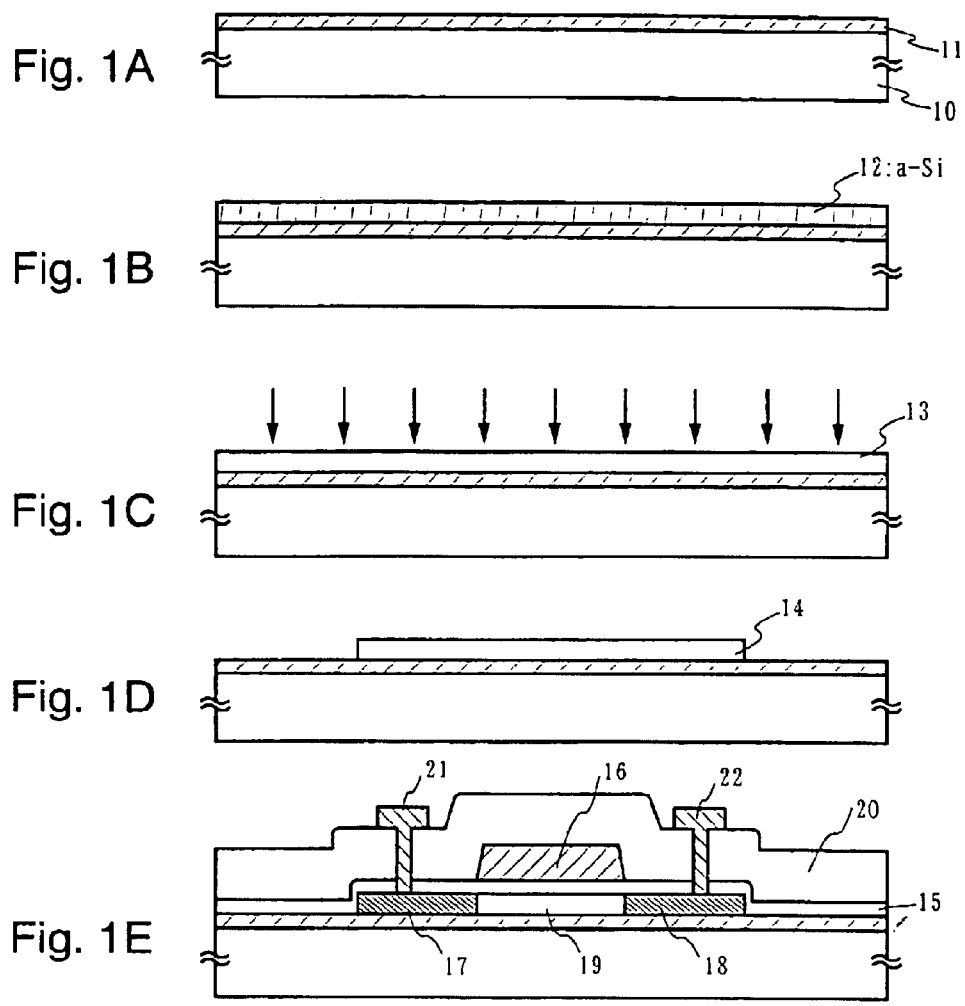

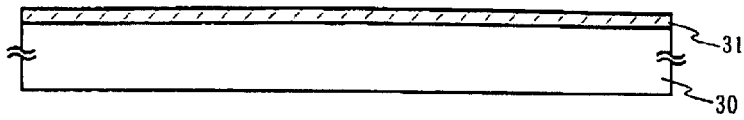
Fig. 2A
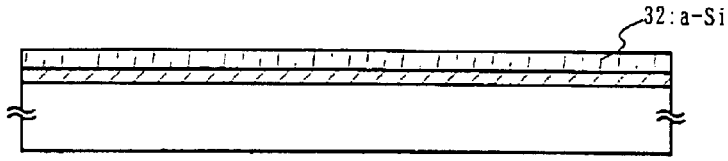
Fig. 2B
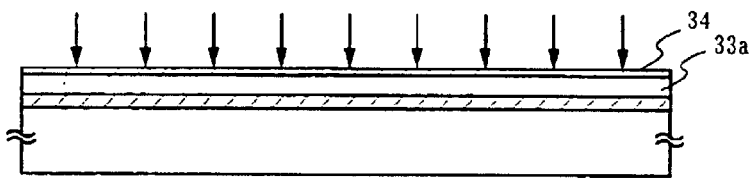
Fig. 2C
Fig. 2D
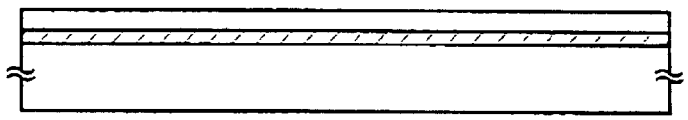
Fig. 2E
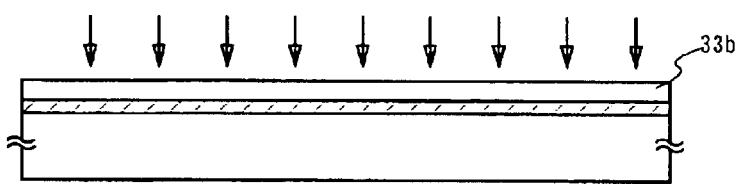
Fig. 2F
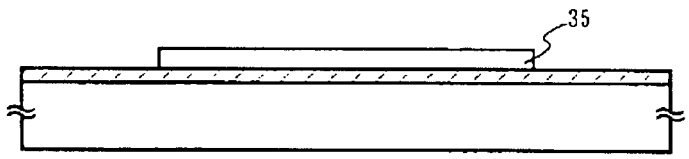
Fig. 2G
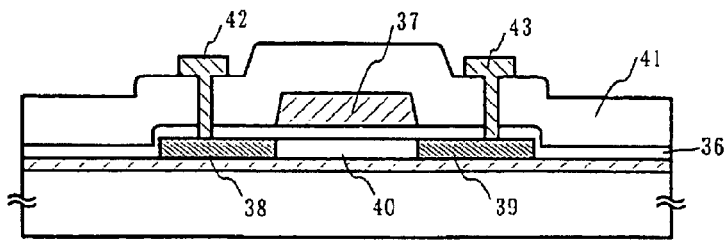

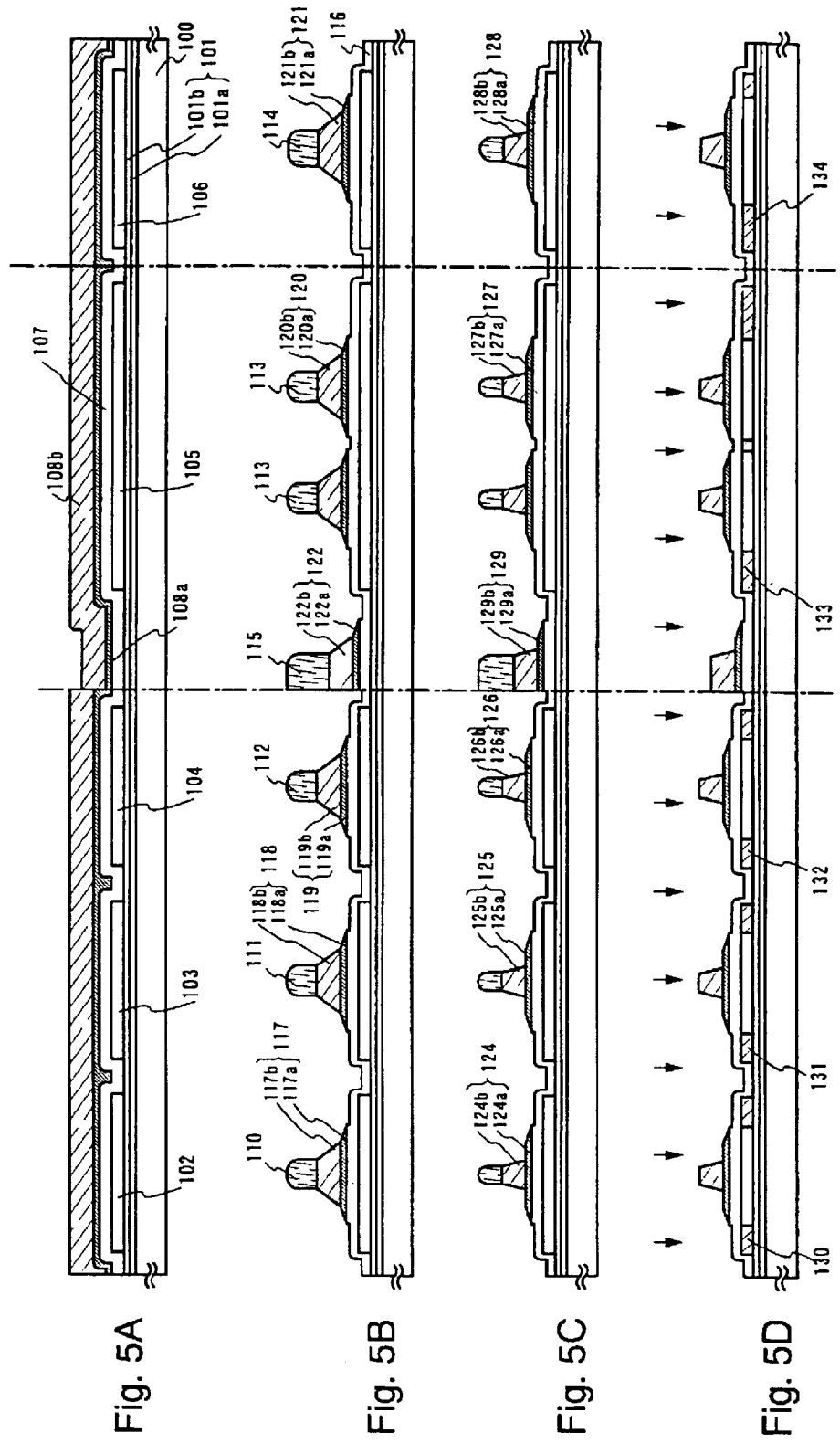

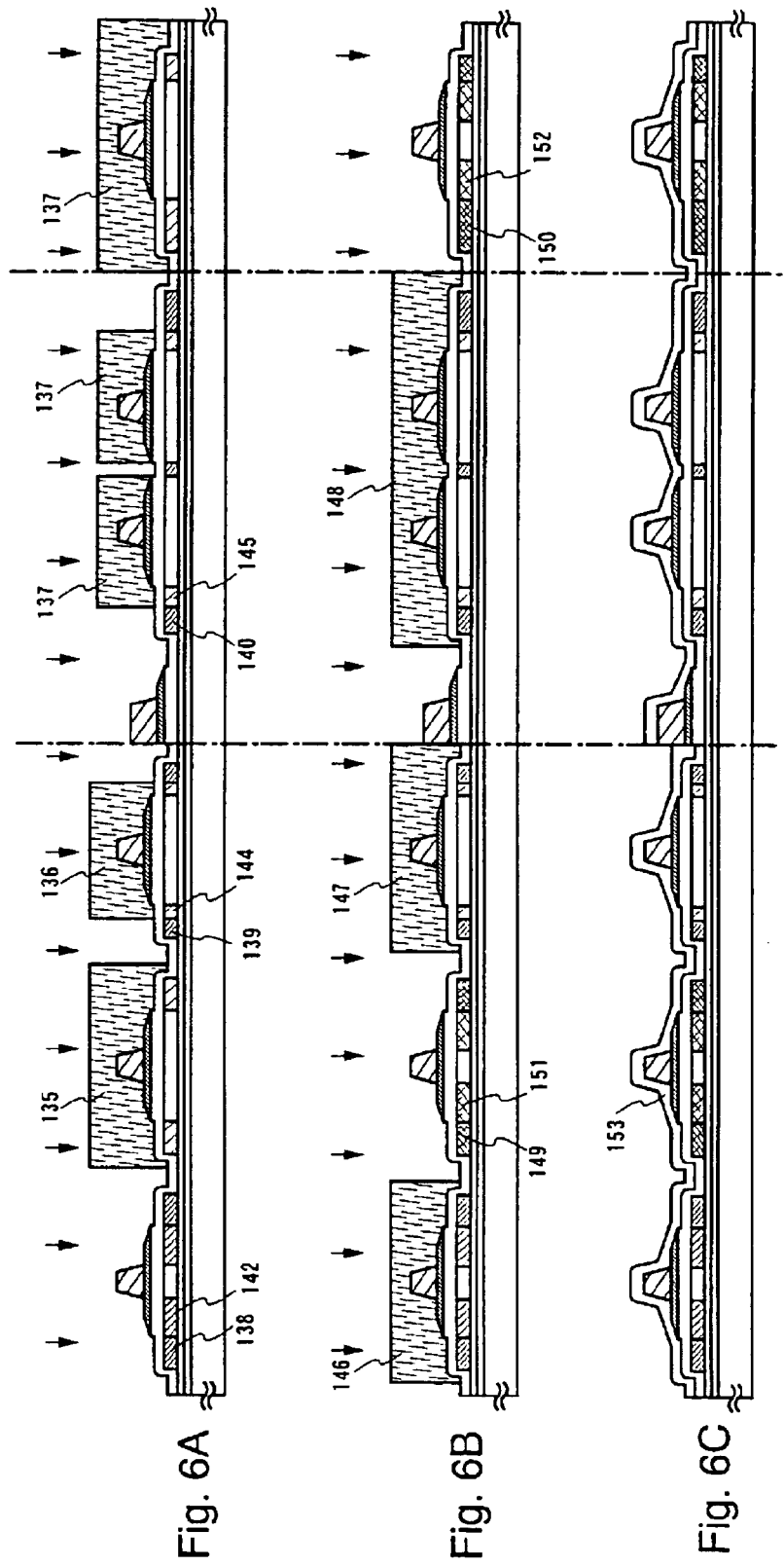

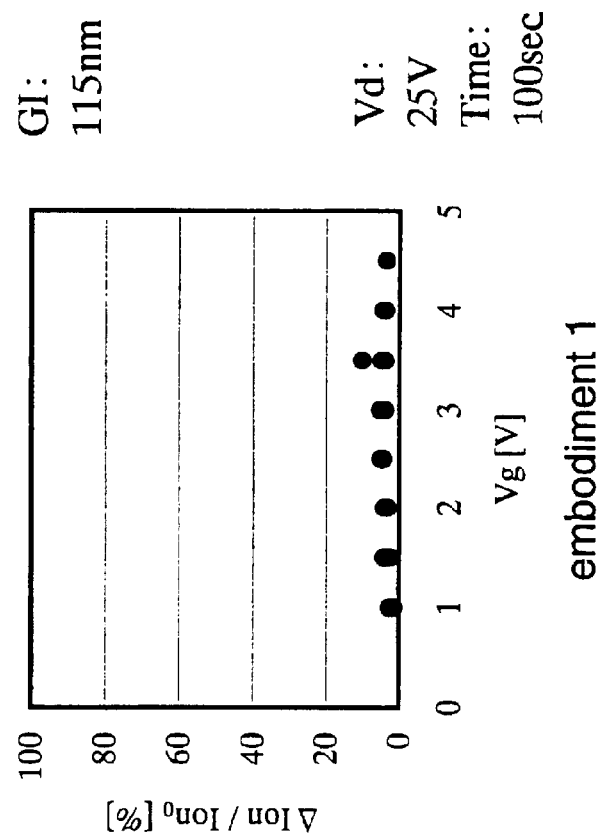
Fig. 9B embodiment 1
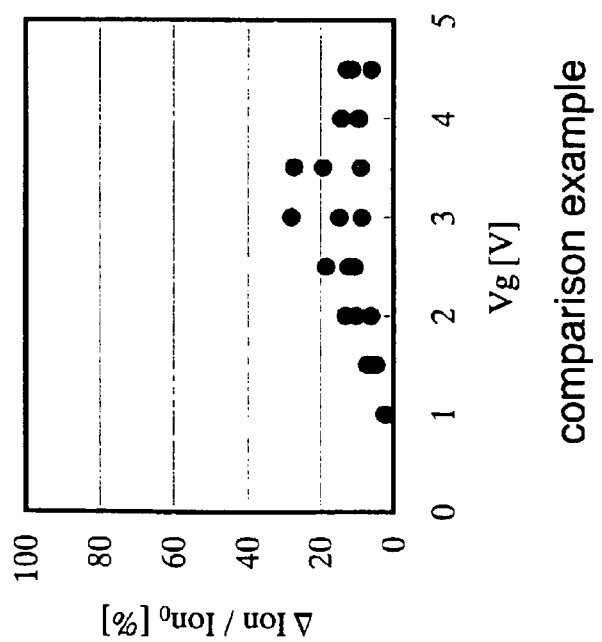
Fig. 9A comparison example

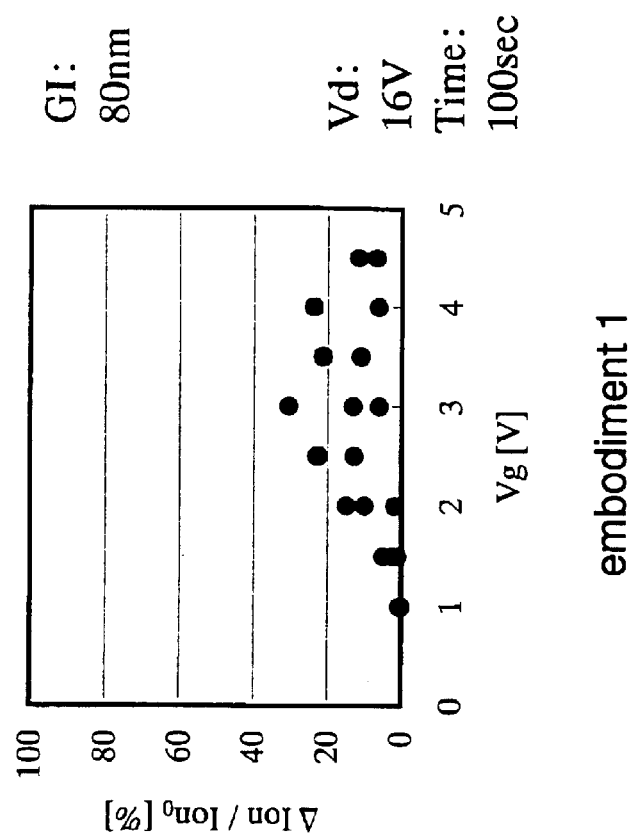
Fig. 10B embodiment 1
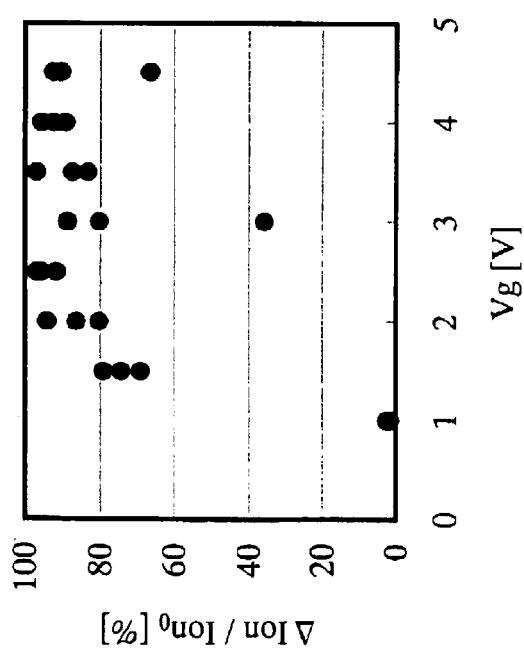
Fig. 10A comparison example

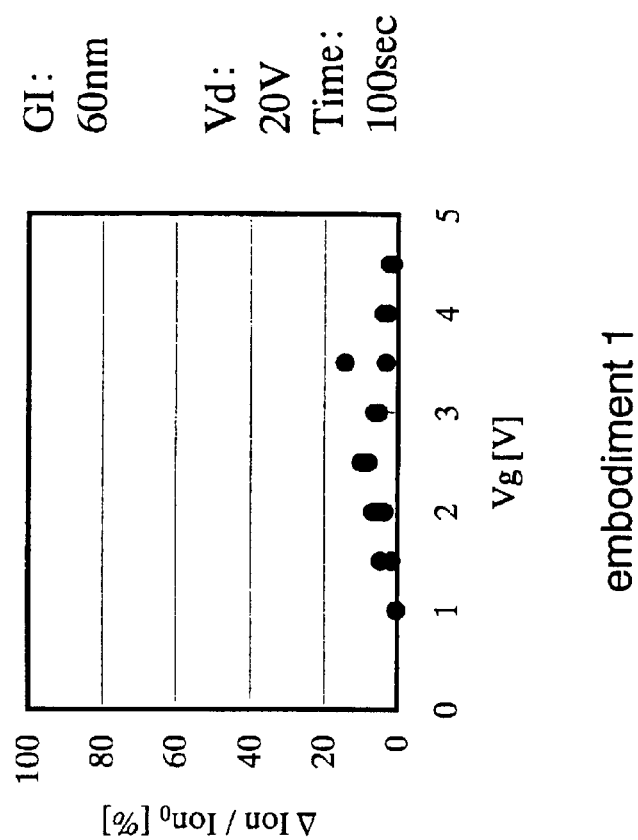
Fig. 11B embodiment 1
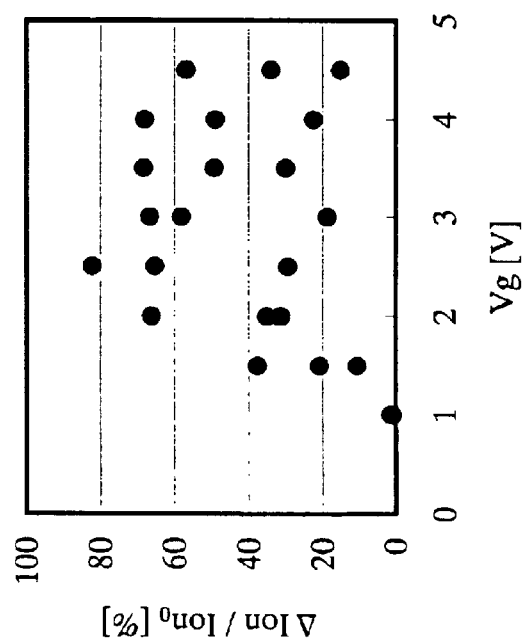
Fig. 11A comparison example

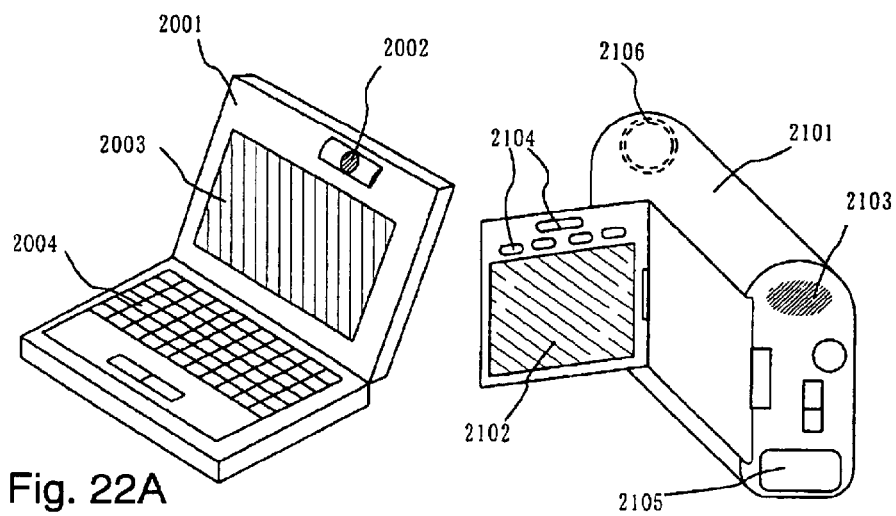
Fig. 22A
Fig. 22B
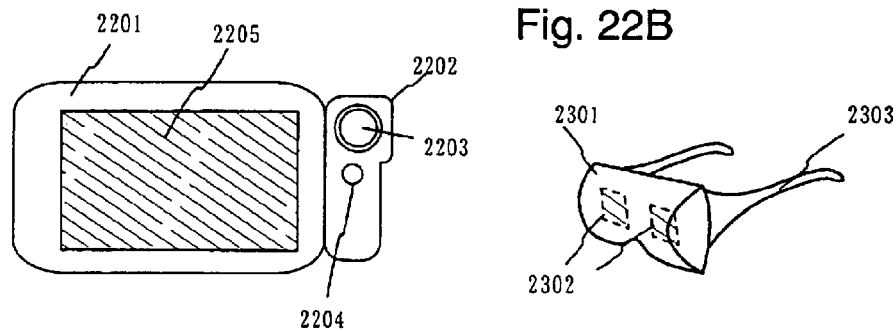
Fig. 22C
Fig. 22D
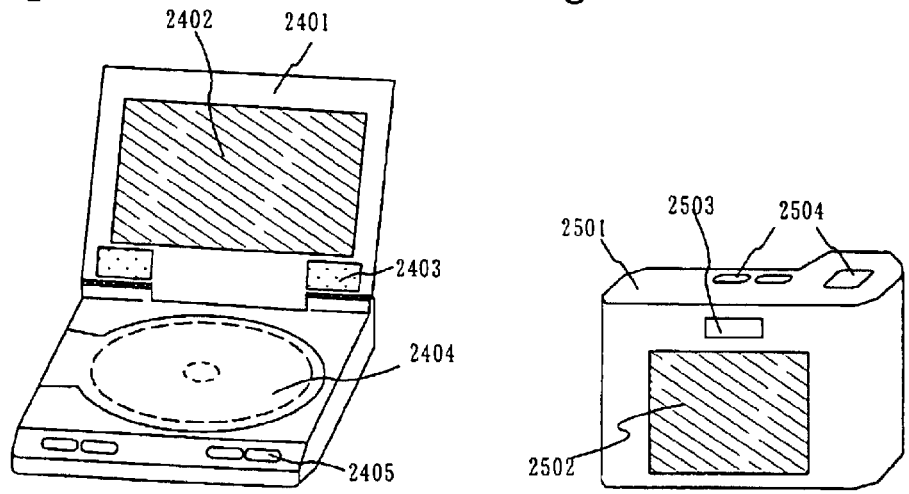
Fig. 22E
Fig. 22F

METHOD OF MANUFACTURING A SEMICONDUCTOR DEVICE WITH LEVELING OF A SURFACE OF A SEMICONDUCTOR FILM THROUGH IRRADIATION

BACKGROUND OF THE INVENTION

1. Field of the Invention

The present invention relates to a semiconductor device having a circuit composed of thin film transistors (hereinafter, referred to as TFTs) and a method of manufacturing the semiconductor device. For example, the present invention relates to an electro-optical device typified by a liquid crystal display panel and an electronic equipment mounted with the electro-optical device as a component.

Note that the term semiconductor device in this specification indicates devices in general capable of functioning with the use of semiconductor characteristics, and electro-optical devices, light emitting devices provided with EL elements and the like, semiconductor circuits and electronic equipment are all included in the category of the semiconductor device.

2. Description of the Related Art

In recent years, a technique of constituting a thin film transistor (TFT) by using a semiconductor thin film (with a thickness of approximately several to several hundred of nm) formed on a substrate having an insulating surface has attracted attention. The thin film transistor is widely applied to an electronic device such as an IC or an electro-optical device, and needs to be developed promptly as, in particular, a switching element of an image display device.

An active matrix liquid crystal module, an EL module, and a contact image sensor are known as typical examples of the thin film transistors. Particularly, a TFT having a silicon film having a crystalline structure (typically, poly-silicon film) as an active layer (hereafter, referred to as polysilicon TFT) has high filed effect mobility, and thus a circuit with various functions can be formed by using the TFT.

For example, in a liquid crystal module mounted to a liquid crystal display device, a pixel portion for performing image display for each functional block and a driver circuit for controlling the pixel portion, such as a shift register circuit, a level shifter circuit, a buffer circuit or a sampling circuit, which is based on a CMOS circuit are formed on one substrate.

Further, TFTs (pixel TFTs) are respectively arranged in several tens to several million of pixels in the pixel portion of the active matrix liquid crystal module, and pixel electrodes are provided to the respective pixel TFTs. Opposing electrodes are provided in an opposing substrate sandwiching liquid crystal with a substrate, and a sort of capacitor with the liquid crystal as dielectric is formed. A voltage applied to the respective pixels is controlled with a switching function of the TFT to control charge to the capacitor to thereby drive the liquid crystal. Thus, a light transmission amount is controlled, thereby displaying an image.

The pixel TFT consists of an n-channel TFT, and applies a voltage to the liquid crystal to drive it as a switching element. Since the liquid crystal is driven by an alternating current, a system called frame inversion driving is often adopted. In this system, in order to suppress power consumption at a low level, it is important to sufficiently lower an off-current value (drain current that flows at the time of off-operation of the TFT) for a characteristic required for the pixel TFT.

Further, in order to manufacture a TFT having superior electrical characteristics at lower cost, a laser annealing technique that enables processing for a short period of time has been essential.

Laser annealing is generally used for a process of crystallizing an amorphous semiconductor film, a process of improving crystallinity, and the like. Note that a laser often used for laser annealing is an excimer laser. A method of conducting laser annealing in which: a laser beam emitted from a pulse oscillation laser with large output is processed by an optical system so as to have a shape of a square spot several by several centimeters or a linear shape with a length of, for example, 10 cm or more on an irradiation surface; and an irradiation position of the laser beam is scanned relative to the irradiation surface, is preferably used since the method provides high productivity and is superior in mass-production. Particularly, when a laser beam having a linear shape (hereinafter referred to as linear beam) is used on the irradiation surface, differently from the case where a spot laser beam, which needs scanning in back and forth directions and right and left directions, is used, the laser beam can be irradiated over the irradiation surface only with the scanning in a direction perpendicular to a line direction of the linear beam, which provides high productivity. The reason the scanning is performed in the direction perpendicular to the line direction is that the perpendicular direction is the most effective scanning direction. Due to the high productivity, the use of the linear beam from a large-output laser, which is processed by an appropriate optical system, is becoming the main stream in laser annealing. Further, the linear beam is irradiated in an overlapping manner while gradually shifting in a short direction, whereby laser annealing is conducted to the entire surface of an amorphous silicon film to crystallize the film or improve the crystallinity.

Further, in order to manufacture a TFT at lower cost, it has been essential to manufacture the TFT on a glass substrate which is cheaper than a semiconductor substrate or a quartz substrate and which can attain a large surface area thereof.

In case of using the glass substrate, in order to prevent alkaline metal contained in the glass substrate from diffusing, a base insulating film comprised of an insulating film containing silicon as its main constituent (silicon oxide film, silicon nitride film, silicon oxynitride film, or the like) is provided, an amorphous silicon film is formed on the film, and then, laser light irradiation is conducted.

The present inventors found a large number of minute holes in the surface of the silicon film that has undergone laser irradiation through many experiments and studies. The minute hole is very small, and a photograph of the hole in SEM (magnification of 35 thousand) observation is shown in FIG. 26. The present inventors found that variation is caused among a large number of TFTs formed on a substrate with the cause of unevenness of the surface of a semiconductor film due to the minute hole. In the case where the active layer of the TFT is formed at the position of the minute hole, the TFT has the poor electrical characteristics in comparison with other TFTs manufactured on the same substrate.

Further, the minute hole often occurs in the case where laser light is irradiated with a relatively high energy density or a relatively high overlap ratio. In particular, there is a tendency that the minute hole appears remarkably in the case where laser light is irradiated in a nitrogen atmosphere or a vacuum.

Moreover, the minute hole occurs in the case where the amorphous silicon film is formed on the base insulating film, but does not occur in the case where the amorphous silicon film is formed contacting the substrate without forming the base insulating film.

Based on the above, the present inventors made many experiments and studies from various angles in order to pinpoint the cause of occurrence of the minute hole. As a result, they further found that minute convex portions were formed in the surface of the amorphous silicon film before laser light irradiation. This minute convex portion is also very small (typically, with a diameter of 1 $\mu$m or less and a height of 0.05 $\mu$m or less), and a photograph of the convex portion in SEM (magnification of 50 thousand) observation is shown in FIG. 25. Note that when the minute convex portion and the vicinity thereof are measured by EDX analysis, it is confirmed that the convex portion is not impurities such as dust.

When the minute convex portion is irradiated with laser light, the minute hole is easy to occur. The present inventors found that the minute convex portion is the cause of occurrence of the minute hole.

The minute convex portion is formed at the step of forming the amorphous silicon film on the base insulating film, and can be observed as an extremely small luminous point by microscopic observation in a dark-field reflection mode with magnification of 500.

Means can be adopted in which the base insulating film is not formed. However, the base insulating film is provided in order that impurity ions such as alkaline metal contained in the glass substrate do not diffuse into a semiconductor film formed above the base insulating film, and is indispensable for manufacture of the TFT at lower cost.

SUMMARY OF THE INVENTION

The present invention has been made in view of the above, and an object of the present invention is therefore to form a base insulating film and an amorphous semiconductor film in lamination on an inexpensive substrate (glass substrate or the like) and to suppress occurrence of a minute convex portion and of a minute hole due to the convex portion even with laser light irradiation. That is to say, an object of the present invention is to obtain an amorphous semiconductor film having an excellent surface in flatness on a base insulating film.

In order to solve the above-mentioned problems, many experiments and studies were made from various angles. As a result, a film deposition temperature of the base insulating film and a film deposition temperature of the amorphous semiconductor film are made substantially equal to each other, whereby the amorphous semiconductor film having a surface which does not have the minute convex portion and which is excellent in flatness can be obtained. Thus, the occurrence of the minute hole can be suppressed even with laser light irradiation.

Note that "film deposition temperatures are made substantially equal to each other"indicates that the ratio of the film deposition temperature of the amorphous semiconductor film to the film deposition temperature of the base insulating film is 0.8 to 1.2, preferably that the difference between the base insulating film and the amorphous semiconductor film in film deposition temperature is in a range of ±50° C.

According to a first structure of the present invention disclosed in this specification, there is provided a method of manufacturing a semiconductor device, comprising:

a first step of forming a base insulating film on an insulating surface;

a second step of forming an amorphous semiconductor film on the base insulating film; and a third step of performing crystallization by irradiation of laser light to the amorphous semiconductor film, thereby forming a semiconductor film having a crystalline structure, characterized in that a film deposition temperature of the base insulating film is the same as a film deposition temperature of the amorphous semiconductor film.

According to a second structure of the present invention, there is provided a method of manufacturing a semiconductor device, comprising:

a first step of forming a base insulating film on an insulating surface;

a second step of forming an amorphous semiconductor film on the base insulating film; and a third step of performing crystallization by irradiation of laser light to the amorphous semiconductor film, thereby forming a semiconductor film having a crystalline structure, characterized in that a difference in film deposition temperature between the base insulting film and the amorphous semiconductor film is in a range of ±50° C.

The film deposition temperature of the base insulating film and the film deposition temperature of the amorphous semiconductor film are made substantially the same, whereby the semiconductor film surface with high flatness can be obtained. By using the semiconductor film with high flatness in the active layer of the TFT, the withstand voltage is raised. Thus, the reliability of the TFT is improved.

Further, the present invention is applicable to not only laser light irradiation in crystallization but also a process with laser light used in the manufacturing process of the semiconductor device, for example, laser annealing used for the improvement of film quality and for the activation of the impurity element.

According to a third structure of the present invention, there is provided a method of manufacturing a semiconductor device, comprising:

a first step of forming a base insulating film on an insulating surface;

a second step of forming an amorphous semiconductor film on the base insulating film; and a third step of performing laser light irradiation to the amorphous semiconductor film, characterized in that a difference in film deposition temperature between the base insulting film and the amorphous semiconductor film is in a range of ±50° C.

Further, in prior art, as a leveling process, there are given an etchback method, in which etching is performed to attain leveling after the formation of an application film, a mechanical chemical polishing (CMP) method, and the like. However, in the present invention, it is only necessary that the film deposition temperature is made the same between the base insulating film and the amorphous semiconductor film, and the reduction in the film thickness due to leveling and the increase in the number of steps are not effected.

Further, the present invention is particularly effective in the case where the base insulating film is required as in case of the glass substrate.

According to a fourth structure of the present invention, there is provided a method of manufacturing a semiconductor device, comprising:

a first step of forming a base insulating film on an insulating surface;

a second step of forming an amorphous semiconductor film on the base insulating film;

a third step of performing crystallization by irradiation of laser light to the amorphous semiconductor film, thereby forming a semiconductor film having a crystalline structure and an oxide film on the semiconductor film, a fourth step of removing the oxide film; and a fifth step of performing laser light irradiation in an inert gas atmosphere or in a vacuum, thereby leveling the surface of the semiconductor film, characterized in that a difference in film deposition temperature between the base insulting film and the amorphous semiconductor film is in a range of ±50° C.

Further, the present invention is particularly effective since minute holes are easy to occur in the case where laser light is irradiated to the semiconductor film in a vacuum or in an inert gas atmosphere.

Further, in the fourth structure, it is characterized in that energy density of the laser light in the fifth step is higher than energy density of the laser light in the third step.

Further, in the fourth structure, it is characterized in that an overlap ratio of the laser light in the fifth step is lower than an overlap ratio of the laser light in the third step.

According to a fifth structure of the present invention, there is provided a method of manufacturing a semiconductor device, comprising:

a first step of forming a base insulating film on an insulating surface;

a second step of forming an amorphous semiconductor film on the base insulating film;

a third step of doping the amorphous semiconductor film with a metal element;

a fourth step of performing heat treatment to the semiconductor film and then performing laser light irradiation, thereby forming a semiconductor film having a crystalline structure and an oxide film on the semiconductor film;

a fifth step of removing the oxide film; and a sixth step of performing laser light irradiation in an inert gas atmosphere or in a vacuum, thereby leveling the surface of the semiconductor film, characterized in that a difference in film deposition temperature between the base insulating film and the amorphous semiconductor film is in a range of ±50° C.

According to a sixth structure of the present invention, there is provided a method of manufacturing a semiconductor device, comprising:

a first step of forming a base insulating film on an insulating surface;

a second step of forming a first semiconductor film having an amorphous structure on the base insulating film;

a third step of doping the first semiconductor film having an amorphous structure with a metal element;

a fourth step of performing heat treatment to the first semiconductor film and then performing laser light irradiation, thereby forming a first semiconductor film having a crystalline structure and an oxide film on the first semiconductor film;

a fifth step of removing the oxide film;

a sixth step of performing laser light irradiation in an inert gas atmosphere or in a vacuum, thereby leveling the surface of the first semiconductor film;

a seventh step of oxidizing the surface of the semiconductor film having a crystalline structure with a solution containing ozone, thereby forming a barrier layer;

an eighth step of forming a second semiconductor film containing a noble gas element on the barrier layer;

a ninth step of gettering the metal element to the second semiconductor film, thereby removing or reducing the metal element in the first semiconductor film having a crystalline structure; and a tenth step of removing the second semiconductor film and the barrier layer, characterized in that a difference in film deposition temperature between the base insulting film and the first semiconductor film having an amorphous structure is in a range of ±50° C.

Further, in the sixth structure, it is characterized in that the noble gas element is one or a plurality of elements selected from the group consisting of He, Ne, Ar, Kr and Xe.

Further, in the sixth structure, it is characterized in that the second semiconductor film is formed by sputtering with semiconductor as a target in an atmosphere containing the noble gas element.

Further, in the fifth structure or the sixth structure, it is characterized in that the heat treatment in the fourth step is a heating process or a process of irradiating a strong light. The strong light is a light emitted from one selected from the group consisting of a halogen lamp, a metal halide lamp, a xenon-arc lamp, a carbon-arc lamp, a high-pressure sodium lamp and a high-pressure mercury lamp.

Further, in the fifth structure or the sixth structure, the metal element is one or a plurality of elements selected from the group consisting of Fe, Ni, Co, Ru, Rh, Pd, Os, Ir, Pt, Cu and Au, which are elements that accelerate crystallization of silicon.

Further, in each of the above-described structures, the laser light is emitted from an excimer laser, an Ar laser or a Kr laser of continuous oscillation or pulse oscillation type, or a YAG laser, a $YVO_4$ laser, a YLF laser, a $YAlO_3$ laser, a glass laser, a ruby laser, an alexandrite laser, or a Ti:sapphire laser of continuous oscillation or pulse oscillation type.

Further, in the fourth structure, the fifth structure or the sixth structure, the inert gas atmosphere is a nitrogen atmosphere.

Further, in the fourth structure, the fifth structure or the sixth structure, the second laser light irradiation is a leveling process performed in a vacuum or in an inert gas atmosphere, and the surface of the semiconductor film is further leveled. Particularly in the case where the gate insulating film is thin, for example, the gate insulating film has a thickness of 100 nm or less, the present invention is very effective.

BRIEF DESCRIPTION OF THE DRAWINGS

In the accompanying drawings:

FIGS. 1A to 1E are views according to the present invention (Embodiment Mode 1);

FIGS. 2A to 2G are views according to the present invention (Embodiment Mode 2);

FIGS. 5A to 5D are views of a manufacturing process of an active matrix substrate;

FIGS. 6A to 6C are views of the active matrix substrate;

FIGS. 9A and 9B are graphs showing deterioration rates in a TFT (a gate insulating film with a thickness of 115 nm);

FIGS. 10A and 10B are graphs showing deterioration rates in a TFT (a gate insulating film with a thickness of 80 nm);

FIGS. 11A and 11B are graphs showing deterioration rates in a TFT (a gate insulating film with a thickness of 60 nm);

FIGS. 22A to 22F show examples of electronic equipment;

DETAILED DESCRIPTION OF THE PREFERRED EMBODIMENTS

Figure 3A:
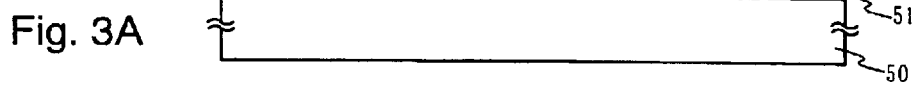
FIGS. 3A to 3G are views according to the present invention (Embodiment Mode 3)

Embodiment modes of the present invention will be described below.

In the present invention, at least a process of forming a base insulating film on an arbitrary insulating surface with a large area, a process of forming a semiconductor film on the base insulating film at the same film deposition temperature as that of the base insulating film, and a process of irradiating laser light to the semiconductor film are provided.

By adopting the same film deposition temperature, a flat semiconductor film surface with no minute convex portion can be obtained at the stage before irradiation of laser light. When laser light irradiation is conducted to the semiconductor film having the flat surface to manufacture a TFT, satisfactory electrical characteristics can be obtained.

Hereinafter, a manufacturing procedure of a typical TFT according to the present invention is simply shown with reference to FIGS. 1A to 4E.

Embodiment Mode 1

Here, an example in which the present invention is applied to a technique of crystallizing an amorphous semiconductor film by laser light irradiation is shown.

In FIG. 1A, reference numeral 10 indicates a substrate having an insulating surface, and reference numeral 11 indicates a base insulating film that becomes a blocking layer.

In FIG. 1A, a glass substrate, a quartz substrate, a ceramic substrate or the like can be used as the substrate 10. Further, a silicon substrate, a metal substrate or a stainless substrate having an insulating film on its surface may also be used. Also, a plastic substrate having heat-resistance that withstands a process temperature in this embodiment mode may be used.

As for the substrate 10, a glass substrate is particularly preferable in a point that the substrate is inexpensive, is easy of supply of a large area substrate, and is suitable for mass-production.

First, the base insulating film 11 is formed on the substrate. As the base insulating film 11, an insulating film of a single layer or a lamination layer selected from a silicon oxide film, a silicon nitride film, a silicon oxynitride ($SiO_xN_y$) film and the like which are obtained by plasma CVD can be used.

As for a typical example of the base insulating film 11, it is preferable that a silicon oxynitride film is formed with a thickness of 50 to 100 nm by using $SiH_4$, $NH_3$ and $N_2O$ as reaction gases and a silicon oxynitride film is formed with a thickness of 100 to 150 nm and with a film deposition temperature of 100 to 450° C. by using $SiH_4$ and $N_2O$ as reaction gases, thereby forming a lamination structure.

Next, a semiconductor film 12 having an amorphous structure is formed on the base insulating film 11 at the same film deposition temperature of that of the base insulating film. (FIG. 1B) The film deposition temperature is made the same, preferably at 300 to 400° C. between the base insulating film and the semiconductor film having an amorphous structure, whereby a flat surface of the semiconductor film which has no minute convex portion can be obtained at the stage before laser light irradiation. The minute convex portion is not seen in observation with SEM at this stage.

A semiconductor material containing silicon as its main constituent is used for the semiconductor film 12 having an amorphous structure. Typically, an amorphous silicon film, an amorphous silicon germanium film or the like is applied, and the film is formed to have a thickness of 10 to 100 nm by plasma CVD.

Subsequently, laser light irradiation is conducted as a technique of crystallizing the semiconductor film 12 having an amorphous structure. (FIG. 1C) A surface state of a semiconductor film 13 having a crystalline structure obtained by the laser light irradiation is good, that is, no minute hole is observed with SEM. Therefore, a size of surface unevenness due to the minute hole, which is regarded as the cause of the unevenness, and variation of characteristics of a TFT are reduced. Note that excimer laser light having a wavelength of 400 nm or less, second harmonic wave or third harmonic wave of a YAG laser, or laser light emitted from a YAG laser, $YVO_4$ laser, YLF laser, $YAlO_3$ laser, glass laser, ruby laser, alexandrite laser, or Ti:sapphire laser of continuous oscillation type or pulse oscillation type is used for laser light. Further, in the case where laser irradiation is conducted in an atmosphere containing oxygen, a thin oxide film (not shown here) is formed on the surface of the semiconductor film. Note that although not shown in the figure, unevenness called ridge is also formed.

Next, a semiconductor layer 14 having a desired shape is formed by patterning the semiconductor film 13 with a known technique. (FIG. 1D) Further, it is desirable that a thin oxide film is formed from ozone water on the surface of the semiconductor layer 14 before formation of a mask made of resist.

Next, after the surface of the semiconductor layer is cleaned with an etchant containing hydrofluoric acid, an insulating film containing silicon as its main constituent is formed as a gate insulating film 15. The surface cleaning and the formation of the gate insulating film are desirably performed in succession without exposure to an atmosphere.

Subsequently, after the surface of the gate insulating film 15 is cleaned, a gate electrode 16 is formed. Then, an impurity element imparting n-type conductivity (P, As or the like), in this case phosphorous, is appropriately added to the semiconductor, thereby forming a source region 17 and a drain region 18. After the addition, heat treatment, irradiation of a strong light or irradiation of a laser light is conducted for activating the impurity element. Further, simultaneously with the activation, plasma damage to the gate insulating film or plasma damage to an interface of the gate insulating film and the semiconductor layer can be recovered. Particularly, it is very effective that the second harmonic wave of the YAG laser is irradiated to a front surface or a back surface to thereby activate the impurity element in an atmosphere at room temperature to 300° C. The YAG laser requires a little amount of maintenance, and thus, is a preferable activation means.

In the subsequent steps, an interlayer insulating film 20 is formed, hydrogenation is conducted, contact holes that reach the source region and the drain region are formed, and a source electrode 21 and a drain electrode 22 are formed, thereby completing a TFT (n-channel TFT). (FIG. 1E) Note that reference numeral 19 indicates a channel forming region and that a semiconductor layer containing at least the channel forming region 19, the drain region 18 and the source region 17 is called an active layer in this specification.

Further, the flatness of the semiconductor surface of the TFT thus obtained is rapidly improved since the occurrence of the minute hole can be suppressed in accordance with the process in this embodiment mode. Thus, an off-current value is reduced, and variation of the off-current value is also reduced. In addition, reliability of the TFT is increased in accordance with the process in this embodiment mode.

Further, the present invention is not limited to the TFT structure in FIG. 1E, and a lightly doped drain (LDD) structure, in which an LDD region is provided between a channel forming region and a drain region (or source region), may be adopted if necessary. In this structure, a region where an impurity element is added at a low concentration is provided between the channel forming region and the source region or the drain region formed by adding an impurity element at a high concentration, and is called an LDD region. Further, a so-called GOLD (gate-drain overlapped LDD) structure may be adopted in which an LDD region is arranged overlapping a gate electrode through a gate insulating film. Since the GOLD structure is a TFT structure with high reliability, higher reliability can be obtained in the case where the present invention is applied to the GOLD structure.

Further, the description is made here with the n-channel TFT. However, of course, a p-channel TFT can be formed by using a p-type impurity element instead of an n-type impurity element.

Further, the description is made here with an example of a top gate type TFT. However, the present invention can be applied irrespective of a TFT structure. For example, the present invention can be applied to a bottom gate type (inverted stagger type) TFT or a stagger type TFT. Also, the present invention can be applied to a TFT with a dual gate structure in which gate electrodes are respectively provided above and below a channel forming region through insulating films.

Moreover, the following may be adopted in which: the semiconductor layer having a desired shape is formed without conducting laser light irradiation before patterning; the surface of the semiconductor layer is cleaned to remove the oxide film or the like; and laser light irradiation is conducted.

Furthermore, the description is made here with an example of crystallization of laser light. However, the present invention is effective irrespective of a crystallization method and the like as long as the method includes a step of using laser light processing. The present invention can be applied to a crystallization method, for example, in which nickel is selectively added to a film and then a laser light irradiation is performed thereon.

Note that, in this specification, the "electrode" is a part of the "wiring" and indicates a point where electrical connection is made with another wiring or a point where the wiring intersects with the semiconductor layer. Therefore, for the sake of convenience of the description, the "wiring" and the "electrode" are separately used. However, the "wiring" is always included in the term "electrode".

Embodiment Mode 2

In this case, an example in which the present invention is applied to a technique of leveling a semiconductor film by laser light irradiation is shown in FIGS. 2A to 2G.

First, in this embodiment mode, the manufacturing steps until the formation of the amorphous semiconductor film are the same as those in Embodiment Mode 1, and thus, detailed description thereof is omitted.

In FIG. 2A, reference numeral 30 indicates a substrate having an insulating surface, reference numeral 31 indicates a base insulating film that becomes a blocking layer. Further, in FIG. 2B, reference numeral 32 indicates a semiconductor film having an amorphous structure. The base insulating film and the semiconductor film are formed at the same film deposition temperature, whereby a flat surface of the semiconductor film with no minute convex portion can be obtained at the stage immediately after the film deposition.

The state of FIG. 2B is obtained in accordance with Embodiment Mode 1. Then, first laser light irradiation (a repetition frequency of 10 to 100 Hz, energy density of 400 to 500 mJ/cm$^2$) is conducted to crystallize the semiconductor film in an atmosphere containing oxygen. (FIG. 2C) Under the irradiation conditions: energy density of 476 mJ/cm$^2$; a repetition frequency of 30 Hz; and an overlap ratio of 91%, the laser light irradiation is conducted in an atmosphere. After the laser light irradiation, a semiconductor film 33a having a crystalline structure is obtained, and an oxide film 34 is formed thereon. Note that, although not shown in the figure here, unevenness called ridge is formed.

Here, an example in which a pulse oscillation laser is used is shown, but a continuous oscillation laser may also be used. In order to obtain crystals with a large particle size in crystallization of the amorphous semiconductor film, it is preferable that a solid laser that enables continuous oscillation is used to apply second harmonic to fourth harmonic waves that have a fundamental wavelength. Typically, the second harmonic wave (532 nm) or the third harmonic wave (355 nm) of a Nd:YVO$_4$ laser (fundamental wavelength, 1064 nm) may be applied. In the case where the continuous oscillation laser is used, laser light emitted from a continuous oscillation YVO$_4$ laser with an output of 10 W is converted into harmonic wave by a non-linear optical element. Further, there is a method of emitting harmonic wave by putting YVO$_4$ crystals and the nonlinear optical element into a resonator. Then, laser light is preferably formed to have a rectangular shape or an elliptical shape on an irradiation surface by an optical system, and the light is irradiated to a member to be processed. Note that the laser light (laser spot) on the irradiation surface is formed to have an elliptical shape having a short diameter of 3 to 100 μm and a long diameter of 100 μm or more with a beam forming means comprised of an optical system. Instead of the elliptical shape, a rectangular shape with a short side of 3 to 100 μm and a long side of 100 μm or more may be adopted. The rectangular shape or the elliptical shape is adopted for conducting laser annealing over the surface of the substrate with efficiency. Here, the reason the length of the long diameter (or long side) is set to 100 μm or more is that it is sufficient that an operator may appropriately determine the length of the long diameter (or long side) as long as the laser light has energy density suitable for laser annealing. The energy density at this time needs to be appropriately 0.01 to 100 MW/cm$^2$ (preferably 0.1 to 10 MW/cm$^2$). The irradiation may be conducted while moving the semiconductor film relative to the laser light at a speed of approximately 10 to 2000 cm/s.

Next, the oxide film 34 is removed. (FIG. 2D)

Then, laser light (second laser light) is irradiated to the semiconductor film 33*a* having a crystalline structure in a nitrogen atmosphere or in a vacuum. The energy density of the second laser light is made larger than that of the first laser light, preferably larger by 30 to 60 mJ/cm$^2$. Incidentally, if the energy density of the second laser light is larger by 90 mJ/cm$^2$ or more than the energy density of the first laser light, the crystallinity of the semiconductor film is reduced, or the semiconductor film is micro-crystallized, which leads to deterioration of the characteristics. Here, with the irradiation conditions: energy density of 537 mJ/cm$^2$ and a repetition frequency of 30 Hz, laser light irradiation is performed in a nitrogen atmosphere. In the case where the laser light irradiation is performed in a nitrogen atmosphere or in a vacuum, a minute hole is easily formed in the semiconductor film. However, the base insulating film and the semiconductor film are formed at the same film deposition temperature, whereby occurrence of the minute hole can be suppressed. Therefore, a size of surface unevenness due to the minute hole, which is regarded as the cause of the unevenness, and variation of characteristics of a TFT can be reduced. Further, the size of the ridge formed by the first laser light irradiation is reduced by the second laser light to level its surface.

Moreover, the continuous oscillation laser may be used for the second laser light. Typically, the second harmonic wave (532 nm) or the third harmonic wave (355 nm) of the Nd:YVO$_4$ laser (fundamental wavelength, 1064 nm) may be applied.

A surface of a semiconductor film 33*b* having a crystalline structure thus obtained is very flat. Further, since the flatness is improved, a gate insulating film formed later can be made thin, and thus, an on-current value of a TFT can be increased. Further, the flatness is improved, whereby an off-current value can be reduced in case of manufacturing the TFT. The reliability of the TFT is also improved.

Next, a semiconductor layer 35 having a desired shape is formed from the semiconductor film by using a known patterning technique. (FIG. 2F)

The subsequent steps are conducted by using the same steps as in Embodiment Mode 1, thereby completing a TFT. (FIG. 2G)

In FIG. 2G, reference numeral 36 indicates a gate insulating film, 37 indicates a gate electrode, 38 indicates a source region, 39 indicates a drain region, 40 indicates a channel forming region, 41 indicates an interlayer insulating film, 42 indicates a source electrode, and 43 indicates a drain electrode.

Further, the following may be adopted in which: the second laser light irradiation is not performed before patterning; a semiconductor layer having a desired shape is formed; the surface of the semiconductor layer is cleaned; the oxide film and the like are removed; and the second laser light irradiation is conducted in an inert gas atmosphere or in a vacuum, thereby leveling the semiconductor layer.

In addition, in the second laser light irradiation, a nitrogen gas may be sprayed to the vicinity of a region to be irradiated.

Embodiment Mode 3

An example is shown in FIGS. 3A to 4E in which the present invention is applied to a technique in which: after a metal element that promotes crystallization of silicon is added, heat treatment is conducted for crystallization; after laser light irradiation is conducted, an oxide film is removed, and laser light irradiation is conducted again to flatten a semiconductor film; and gettering is conducted for removing the metal element.

First, in this embodiment mode, the manufacturing steps until the formation of the amorphous semiconductor film are the same as those in Embodiment Mode 1. Thus, detailed description thereof is omitted.

In FIG. 3A, reference numeral 50 indicates a substrate having an insulating surface, and reference numeral 51 indicates a base insulating film that becomes a blocking layer. Further, in FIG. 3B, reference numeral 52 indicates a semiconductor film having an amorphous structure. The base insulating film and the semiconductor film are formed at the same film deposition temperature, whereby a flat surface of the semiconductor film with no minute convex portion can be obtained at the stage immediately after the film deposition.

Figure 3B:
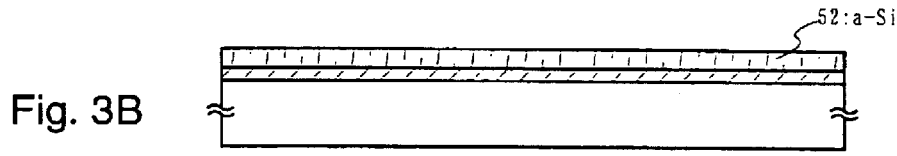
Figure 3C:
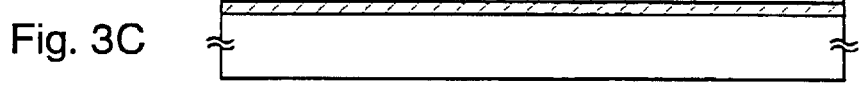

The state of FIG. 3B is obtained in accordance with Embodiment Mode 1. Then, the first semiconductor film 52 having an amorphous structure is crystallized by using a technique disclosed in Japanese Patent Application Laid-open No. Hei 8-78329 for crystallization of the first semiconductor film 52. With the technique disclosed in the above, a metal element that promotes crystallization is selectively added to an amorphous silicon film, and heat treatment is conducted thereto, thereby forming a semiconductor film having a crystalline structure which spreads with the added region as the starting point. First, a nickel acetate salt solution containing a metal element (in this case, nickel) of 1 to 100 ppm in weight which has catalysis that promotes crystallization, is applied to the surface of the first semiconductor film 52 having an amorphous structure by using a spinner, thereby forming a nickel containing layer 53. (FIG. 3C) Besides the formation method of the nickel containing layer 53 by application, a method of forming an extremely thin film by sputtering, evaporation or plasma processing may be used. Further, an example of application to the entire surface is shown here. However, the nickel containing layer may be selectively formed with the formation of a mask.

Figure 3D:
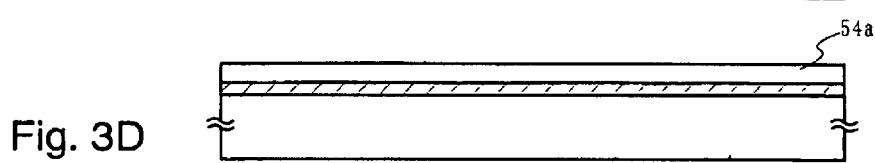
Figure 3E:
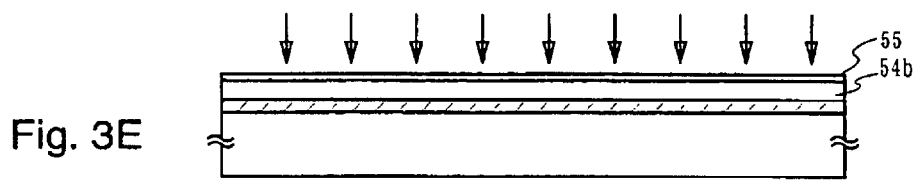

Next, heat treatment is conducted to perform crystallization. In this case, silicide is formed at the portion of the semiconductor film, which contacts the metal element that promotes crystallization of the semiconductor film, and the crystallization progresses with the silicide as the nucleus. Thus, a first semiconductor film 54*a* having the crystalline structure shown in FIG. 3D is formed. Note that a concentration of oxygen contained in the first semiconductor film 54a after crystallization is desirably set to $5\times10^{18}/cm^3$ or less. Here, after heat treatment (450° C. for 1 hour) for hydrogenation is conducted, heat treatment (550° C. to 650° C. for 4 to 24 hours) for crystallization is conducted. Further, in the case where crystallization is conducted by strong light irradiation, one of infrared light, visible light, and ultraviolet light or a combination thereof can be used. Typically, light emitted from a halogen lamp, a metal halide lamp, a xenon-arc lamp, a carbon-arc lamp, a high-pressure sodium lamp or a high-pressure mercury lamp is used. A lamp light source is turned on for 1 to 60 seconds, preferably 30 to 60 seconds, and this is repeated 1 to 10 times, whereby the semiconductor film is sufficiently heated to be instantaneously at about 600 to 1000° C. Note that, before the strong light irradiation, heat treatment for releasing hydrogen contained in the first semiconductor film 52 having an amorphous structure may be conducted if necessary. Further, crystallization may be conducted by simultaneously performing the heat treatment and the strong light irradiation. Taking the productivity into consideration, it is desirable that crystallization is conducted with the strong light irradiation.

The metal element (in this case, nickel) remains in the first semiconductor film 54a thus obtained. The metal element remains at a concentration of more than $1\times10^{19}/cm^3$ as an average concentration even if the metal element is not uniformly distributed in the film. Of course, even in the above-described state, various semiconductor elements, including a TFT, can be formed. However, the element is removed by the method shown below.

Next, in order to raise a crystallization rate (ratio of a crystal component to the total volume of the film) and to repair a defect remaining in a crystal grain, laser light (first laser light) is irradiated to the first semiconductor film 54a having a crystalline structure in an atmosphere or an oxygen atmosphere. In the case where the laser light (first laser light) is irradiated, a thin oxide film 55 is formed together with unevenness on the surface of the semiconductor film. (FIG. 3E) Excimer laser light with a wavelength of 400 nm or less, the second harmonic wave or third harmonic wave of a YAG laser, or the second harmonic wave (532 nm) or third harmonic wave (355 nm) of a continuous oscillation Nd:YVO$_4$ laser (fundamental wavelength, 1064 nm) may be applied to the laser light (first laser light).

Figure 3F:
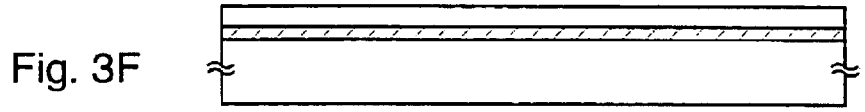

Then, the oxide film 55 formed by the first laser light irradiation is removed. (FIG. 3F)

Figure 3G:
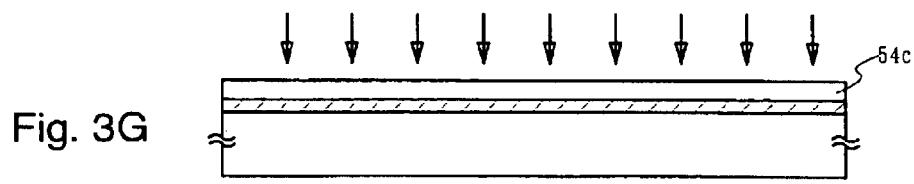

Next, laser light (second laser light) is irradiated to the first semiconductor film having a crystalline structure in a nitrogen atmosphere or in a vacuum. In the case where the laser light is irradiated in the nitrogen atmosphere or in the vacuum, a minute hole is easily be formed in the semiconductor film. However, the base insulating film and the semiconductor film are formed at the same film deposition temperature, whereby the occurrence of the minute hole can be suppressed. Therefore, a size of surface unevenness due to the minute hole, which is regarded as the cause of the unevenness, and variation of characteristics of a TFT can be reduced. Further, in the case where the laser light (second laser light) is irradiated, the ridge formed by the first laser light irradiation is reduced, namely, flattened. (FIG. 3G)

Figure 4A:
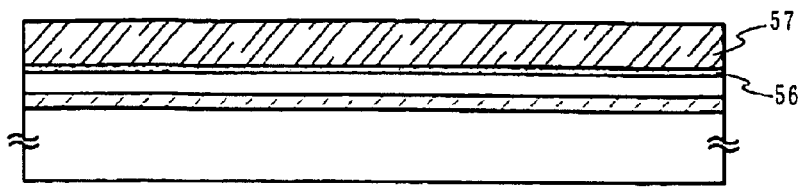
FIGS. 4A to 4E are views according to the present invention (Embodiment Mode 3)
Figure 4B:
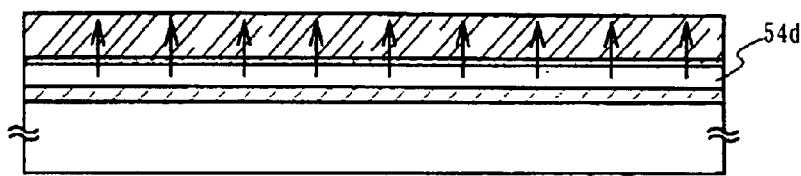
Figure 4C:
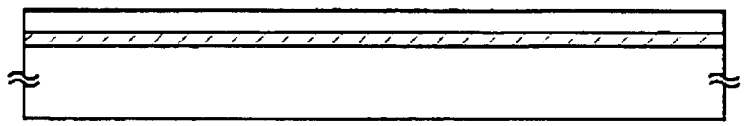
Figure 4D:
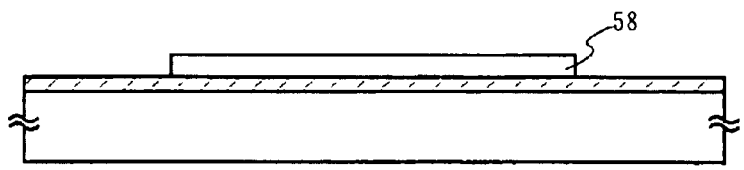

Next, an oxide film (called chemical oxide) is formed with an ozone-containing aqueous solution (typically, ozone water) to form a barrier layer 56 comprised of an oxide film of 1 to 10 nm. A second semiconductor film 57 containing a noble gas element is formed on the barrier layer 56. (FIG. 4A)

Further, as another method of forming the barrier layer 56, ozone may be made to generate by irradiation of ultraviolet light in an oxygen atmosphere to thereby oxidize the surface of the semiconductor film having a crystalline structure. Further, as still another method of forming the barrier layer 56, an oxide film with a thickness of about 1 to 10 nm may be deposited by plasma CVD, sputtering or evaporation. Also as still another method of forming the barrier layer 56, a thin oxide film may be formed by heating to approximately 200 to 350° C. with a clean oven. Note that the barrier layer 56 is not particularly limited as long as it is formed by one of the above methods or a combination thereof. However, it is required that the barrier layer has a film quality or a film thickness that enables the nickel in the first semiconductor film to move to the second semiconductor film by gettering which is performed later.

Here, a second semiconductor film 57 containing a noble gas element is formed by sputtering to form a gettering site. One or a plurality of elements selected from the group consisting of helium (He), neon (Ne), argon (Ar), krypton (Kr), and xenon (Xe) are used as the noble gas element. Above all, argon (Ar) is preferable since it is an inexpensive gas. The second semiconductor film is formed by using a target comprised of silicon in an atmosphere containing the noble gas element. There are two intentions to make noble gas element ions be contained in an inert gas in the film. One intention is to form dangling bonds to impart distortion to the semiconductor film. The other intention is to impart distortion between lattices of the semiconductor film. The distortion is remarkably imparted between lattices of the semiconductor film when an element having an atomic radius larger than that of silicon, such as argon (Ar), krypton (Kr) or xenon (Xe) is used. Further, the noble gas element is contained in the film, whereby not only the distortion between lattices but also the dangling bonds are formed, which contributes to a gettering action.

Next, heat treatment is performed to perform gettering for reducing the concentration of a metal element (nickel) or removing the metal element in the first semiconductor film. (FIG. 4B) Process of irradiating strong light or a heating process may be conducted as the heat treatment for performing gettering. By the gettering, the metal element moves in a direction indicated by an arrow in FIG. 4B (namely, a direction toward the surface of the second semiconductor film from the substrate side), and the removal of the metal element or the reduction of the concentration of the metal element, which is contained in a first semiconductor film 54d covered by the barrier layer 56 is conducted. It is sufficient that the distance in which the metal element moves in gettering is a distance substantially equal to at least a thickness of the first semiconductor film, and gettering can be completed for a relatively short time. Here, nickel is made to move to the second semiconductor film 57 such that it does not segregate in the first semiconductor film 54d, and gettering is sufficiently conducted such that nickel contained in the first semiconductor film 54d hardly exists, that is, the nickel concentration in the film is set to $1\times10^{18}/cm^3$ or less, desirably $1\times10^{17}/cm^3$ or less.

Further, in the above gettering, repairs of damage due to the laser light irradiation (first laser light and second laser light) are simultaneously performed.

Next, after only the second semiconductor film indicated by reference numeral 57 is selectively removed with the barrier layer 56 as an etching stopper, the barrier layer 56 is removed, and the first semiconductor film 54d is patterned with a known technique to form a semiconductor layer 58 having a desired shape.

A TFT is completed by conducting the subsequent steps that are the same as those in Embodiment Mode 1. (FIG. 4E)

Figure 4E:
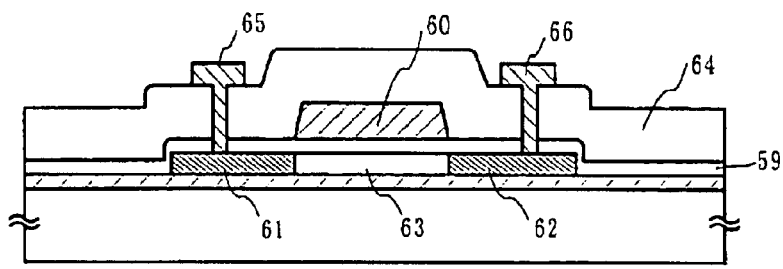

In FIG. 4E, reference numeral 59 indicates a gate insulating film, 60 indicates a gate electrode, 61 indicates a source region, 62 indicates a drain region, 63 indicates a channel forming region, 64 indicates an interlayer insulating film, 65 indicates a source electrode, and 66 indicates a drain electrode.

Further, this embodiment mode can be combined with Embodiment Mode 1. In addition, this embodiment mode can be combined with another known gettering technique.

Further, in this embodiment mode, an example in which the second laser light irradiation is conducted before gettering is shown. However, the following process may be adopted in which: after the first laser light irradiation, a barrier layer and a semiconductor film containing a noble gas are formed; gettering is performed by heat treatment; the semiconductor film containing a noble gas element and the barrier layer are removed; and then, the second laser light irradiation is conducted in an inert gas atmosphere or in a vacuum.

Moreover, the second laser light irradiation may not be conducted before gettering. An oxide film and the like are removed by cleaning after the formation of a semiconductor layer having a desired shape, and then, the second laser light irradiation may be conducted in an inert gas atmosphere or in a vacuum for leveling the surface.

Furthermore, in the second laser light irradiation, a nitrogen gas may be sprayed to the vicinity of a region to be irradiated.

Embodiment Mode 4

Here, an example is shown in which a throughput is improved upon hereby to surface with laser light in Embodiment Mode 2 or Embodiment Mode 3.

Laser light irradiation is conducted twice in Embodiment Mode 2 or Embodiment Mode 3, and thus, the throughput is lowered. Therefore, in this embodiment mode, in case of a pulse oscillation type laser, the number of shots of the second laser, namely, the overlap ratio is made smaller than that of the first laser light.

Specifically, the overlap ratio of the first laser light is set to 90% or more, preferably 95 to 98%, and the overlap ratio of the second laser light is preferably set to 60 to 90%, preferably 70 to 85%. The overlap ratio of the second laser light can attain sufficiently leveling of the surface even if it is smaller than the overlap ratio of the first laser light.

Therefore, the overlap ratio of the second laser light can be made smaller, and thus, the throughput is remarkably improved. Further, since the second laser light irradiation is performed, the overlap ratio of the first laser light can also be lowered.

Note that this embodiment mode can be applied to Embodiment Mode 1 or Embodiment Mode 2.

The present invention structured as described above will further be described in detail with embodiments shown below.

Embodiments

Embodiment 1

An embodiment of the present invention is described with reference to FIGS. 5A to 7. Here, a method of simultaneously manufacturing a pixel portion and TFTs (n-channel TFTs and a p-channel TFT) of a driver circuit provided in the periphery of the pixel portion on the same substrate is described in detail.

First, a base insulating film 101 is formed on a substrate 100, and a first semiconductor film having a crystalline structure is obtained. Then, the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 101b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_XGe_{1-X}$ (X=0.0001 to 0.02)) alloy by using a known means (sputtering, LPCVD, plasma CVD, or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2 \times 10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 mJ/cm$^2$. Note that an oxide film is formed on the surface by the first laser light irradiation since the irradiation is conducted in an atmosphere or in an oxygen atmosphere.

Also note that, although a technique of irradiating laser light is used after thermal crystallization is conducted by using nickel as the metal element that promotes crystallization of silicon, an amorphous silicon film may be crystallized by means of a continuous oscillation laser (second harmonic wave of a YVO$_4$ laser) without adding nickel.

Next, after the oxide film formed by the first light irradiation is removed by dilute hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser is used as the laser light (second laser light). The energy density of the second laser light is made larger than that of the first laser light, preferably made larger by 30 to 60 mJ/cm$^2$. Here, the second laser light irradiation is performed with a repetition frequency of 30 Hz and energy density of 453 mJ/cm$^2$ to thereby set a P-V value of unevenness in the semiconductor film surface to 5 nm or less. In case of the second laser light irradiation, the difference in level of unevenness (P-V value: peak to valley, the difference between the maximum value and the minimum value in height) formed by the first laser light irradiation is reduced, namely, flattened. Here, the P-V value of unevenness may be observed with AFM (atomic force microscope). The AFM enables measurement of a center line average height (Ra), root mean square roughness (Rms), ten point average surface roughness (Rz), and average tilt angle (Äa) as other indexes indicating the surface roughness.

The energy density of the second laser light irradiation is made larger by 30 mJ/cm$^2$ to 60 mJ/cm$^2$ (430 to 560 mJ/cm$^2$) than that of the first laser light irradiation, whereby flatness is remarkably improved in comparison with before the irradiation. For example, the surface roughness (P-V value, Ra, Rms) is reduced to ½ or less, or ⅓ or less in comparison with before the irradiation. When a comparison experiment was conducted, the surface of the semiconductor film irradiated with the second laser light with energy density higher by 60 mJ/cm$^2$ than that of the first laser light was the flattest surface.

Further, although the second laser light irradiation is conducted over the surface in this embodiment, a step of selectively performing irradiation at least on a pixel portion may be adopted since the reduction of an off current particularly has an effect on a TFT of the pixel portion.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration of the argon element contained in the amorphous silicon film is $3 \times 10^{20}$/cm$^3$ to $6 \times 10^{20}$/cm$^3$, and the atomic concentration of oxygen is $1 \times 10^{19}$/cm$^3$ to $3 \times 10^{19}$/cm$^3$.

Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 107, is formed. In this embodiment, a silicon oxynitride film (composition ratio: Si=32%, O=59%, N=7%, H=2%) is formed with a thickness of 115 nm by plasma CVD.

Next, as shown in FIG. 5A, on the gate insulating film 107, a first conductive film 108a with a thickness of 20 to 100 nm and a second conductive film 108b with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 5B, masks 110 to 115 are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this embodiment, RF (13.56 MHz) power of 150 W is applied also to the substrate (sample stage) to substantially apply a negative self-bias voltage. With the first etching conditions, a W film is etched to form an end portion of the first conductive layer into a tapered shape. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15 to 45°.

Thus, first shape conductive layers 117 to 121 composed of the first conductive layer and the second conductive layer (first conductive layers 117a to 121a and second conductive layers 117b to 121b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ratio of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 121a. In actuality, the width of the first conductive layer may be reduced by approximately 0.3 µm, namely, approximately 0.6 µm in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 5D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner. The impurity element imparting n-type conductivity is added to the first impurity regions 130 to 134 in a concentration range of $1 \times 10^{16}$ to $1 \times 10^{17}$/cm$^3$. Here, the region having the same concentration range as the first impurity region is also called an n$^-$ region.

Note that although the first doping process is performed after the removal of the masks made of resist in this embodiment, the first doping process may be performed without removing the masks made of resist.

Subsequently, as shown in FIG. 6A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1 \times 10^{20}$ to $1 \times 10^{21}$/cm$^3$. Here, the region having the same concentration range as the second impurity region is also called an n$^+$region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 6B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1 \times 10^{20}$ to $1 \times 10^{21}$/cm$^3$. Note that, in the fourth impurity regions 149, 150, phosphorous (P) has been added in the preceding step (n$^-$ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p$^+$ region.

Further, fifth impurity regions 151 and 152 are formed in regions overlapping the tapered portion of the second conductive layer 125a, and are added with the impurity element imparting p-type conductivity in a concentration range of $1 \times 10^{18}$ to $1 \times 10^{20}$/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers. (FIG. 6C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 µm is formed. Then, a contact hole that reaches the source wiring 129, contact holes that respectively reach the conductive layers 127 and 128, and contact holes that reach the respective impurity regions are formed. In this embodiment, a plurality of etching processes are sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 7) In this specification, the above substrate is called an active matrix substrate for the sake of convenience.

Figure 8:
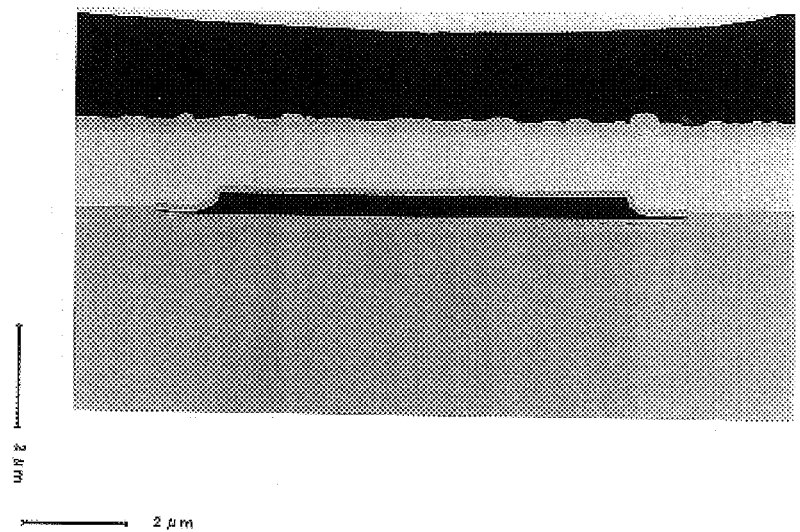
FIG. 8 is a photograph of a vicinity of a gate electrode in observation with TEM.

Further, FIG. 8 shows a photograph of a vicinity of the gate electrode in section in observation with TEM. As shown in FIG. 8, the semiconductor film surface is flat due to the second laser light. Since the semiconductor film is flat, the influence of unevenness in the semiconductor film surface is hardly seen in the gate insulating film above the semiconductor film, and in the tapered portion of the gate electrode.

In the pixel portion 207, the pixel TFT 204 (n-channel TFT) has a channel forming region 167, the first impurity region (n⁻ region) 145 formed outside the conductive layer 127 forming the gate electrode, and the second impurity region (n⁺ region) 140 functioning as a source region. Further, in the semiconductor layer functioning as one of the electrodes of the storage capacitor 205, the fourth impurity region 150 and the fifth impurity region 152 are formed. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n⁻ region) 142 that overlaps a part of the conductive layer 124 forming the gate electrode through the insulating film, and the second impurity region (n⁺ region) 138 functioning as a source region or a drain region.

Further, in the driver circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driver circuit 206, the n-channel TFT 203 (second n-channel TFT) has a channel forming region 166, the first impurity region (n⁺ region) 144 outside the conductive layer 126 forming the gate electrode, and the second impurity region (n⁺ region) 139 functioning as a source region or a drain region.

The above TFTs 201 to 203 are appropriately combined to form a shift resister circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

Furthermore, the electrical characteristics of the n-channel TFT 201, which is obtained in accordance with this embodiment, were measured, and the reliability was inspected. Here, fluctuation of an on-current value (also referred to as deterioration rate) which is the index of the reliability is obtained. Note that the on-current value is obtained by the measurement with a drain voltage Vd=1 V and a gate voltage Vg=10 V.

First, in order to find characteristic variation of the n-channel TFT 201 due to a transient stress, after the on-current value before application of the transient stress (IonO) is measured, the transient stress is applied to each on-current value at a room temperature for 100 seconds, assuming that the drain voltage Vd=+25 V and the gate voltage Vg=1 V, 1.5 V, 2 V, 2.5 V, 3 V, 3.5 V, 4 V, 4.5 V. Thereafter, the on-current value is measured again, and the on characteristic fluctuation before and after the application of the transient stress (ΔIon/IonO) is shown in FIGS. 9A and 9B. The transient stress indicates a stress at the time when the drain voltage of a TFT is set to a certain value and the gate voltage is fixed for a certain period of time. Note that the size of the channel forming region of the TFT is set to channel length L/channel width W=10 μm/8 μm, and the TFT is measured in which the width in the channel length direction is 1.1 μm in the third impurity region 142 that overlaps the gate electrode through the gate insulating film (film thickness of 115 nm).

As a comparison example, the TFT is used which is manufactured by the step of not performing the second laser irradiation but only performing the first laser irradiation in this embodiment.

The fluctuation of the on-current value (deterioration rate) is smaller in this embodiment (FIG. 9B) in comparison with the comparison example (FIG. 9A). Thus, it is shown that the reliability of the TFT is higher in the case where the second laser irradiation is conducted to flatten the surface of the semiconductor film.

Further, similar comparison is made in which the film thickness of the gate insulating film is varied. When the thickness of the gate insulating film is 80 nm, FIGS. 10A and 10B show the on characteristic fluctuation (ΔIon/IonO) in the case where the transient stress is applied to each on-current value at a room temperature for 100 seconds, assuming that the drain voltage Vd=+16 V and the gate voltage Vg=1 to 4.5 V. Where, FIG. 10A is a measurement of a comparison example, and FIG. 10B is a measurement of this embodiment. Further, when the thickness of the gate insulating film is 60 nm, FIGS. 11A and 11B show the on characteristic fluctuation (ΔIon/IonO) in the case where the transient stress is applied to each on-current value at a room temperature for 100 seconds, assuming that the drain voltage Vd=+20 V and the gate voltage Vg=1 to 4.5 V. Where, FIG. 11A is a measurement of a comparison example, and FIG. 11B is a measurement of this embodiment.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

Figure 12:
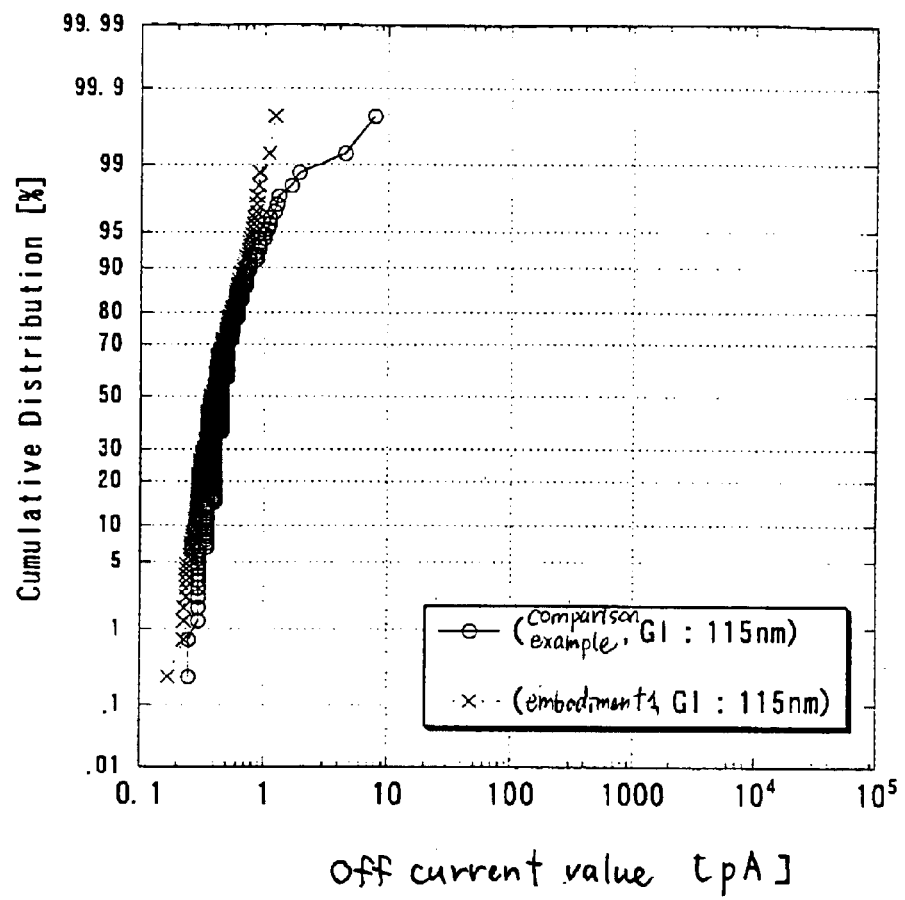
FIG. 12 is a graph showing an off-current value in a TFT (a gate insulating film with a thickness of 115 nm) with L/W=2/8.
Figure 13:
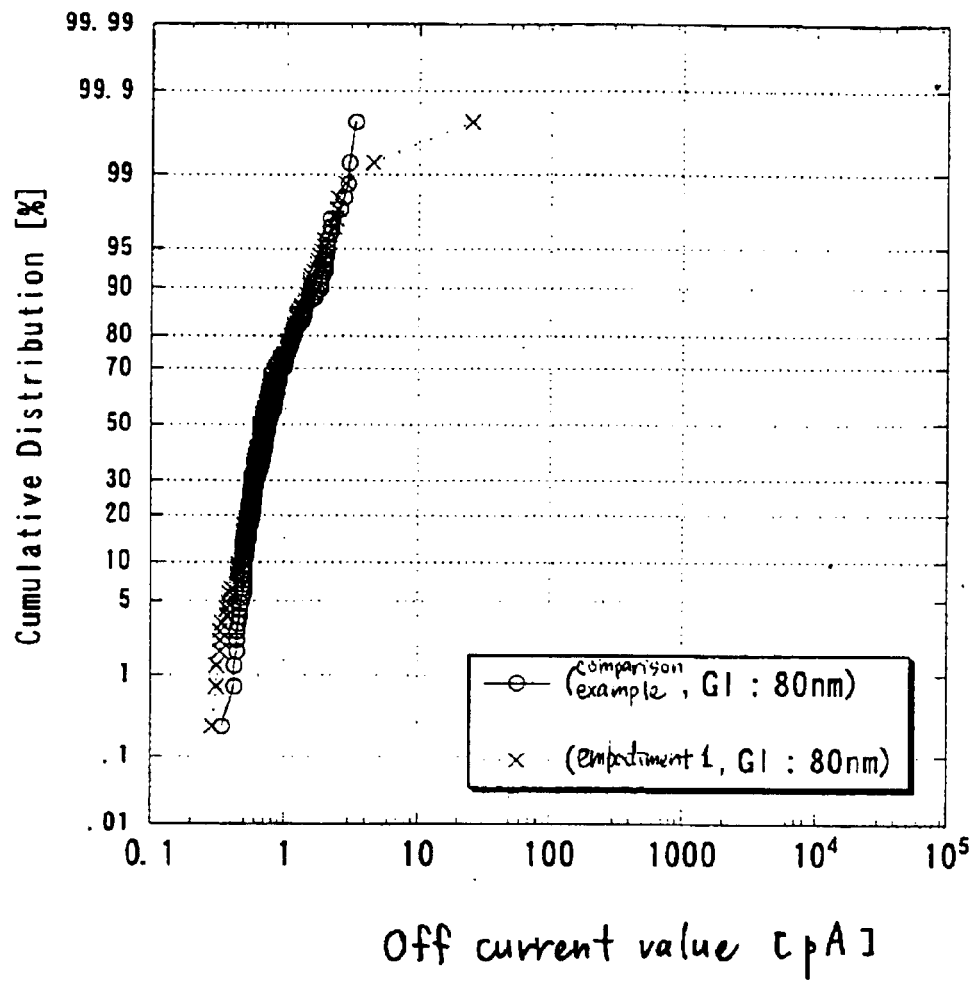
FIG. 13 is a graph showing an off-current value in a TFT (a gate insulating film with a thickness of 80 nm) with L/W=2/8.
Figure 14:
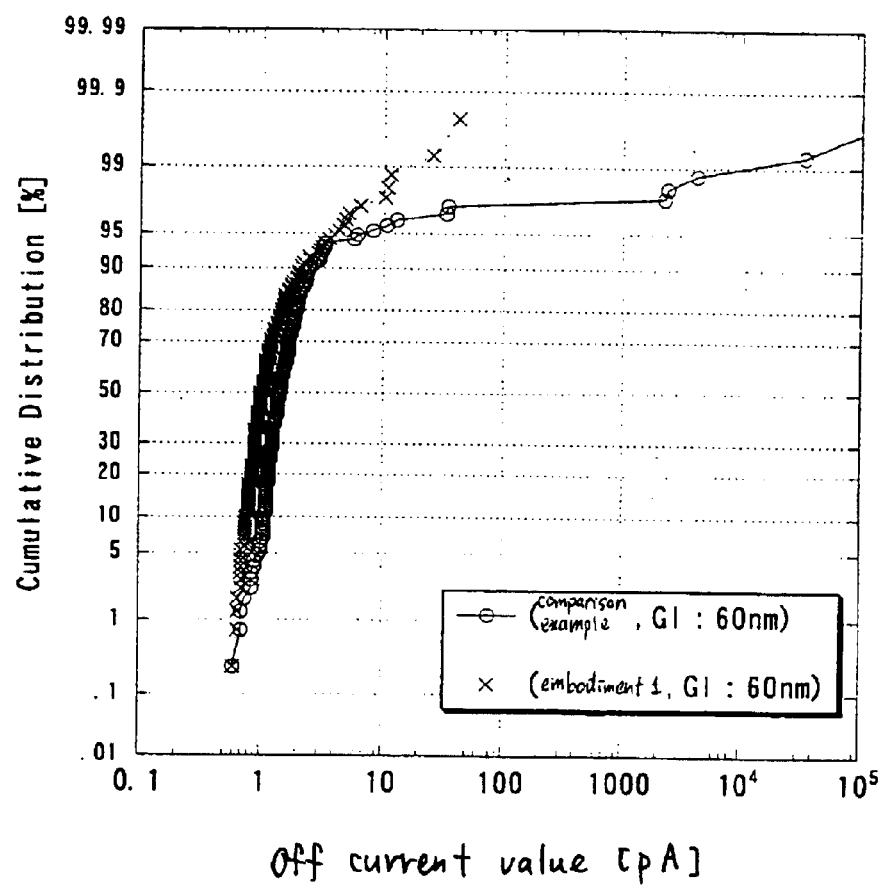
FIG. 14 is a graph showing an off-current value in a TFT (a gate insulating film with a thickness of 60 nm) with L/W=2/8.
Figure 15:
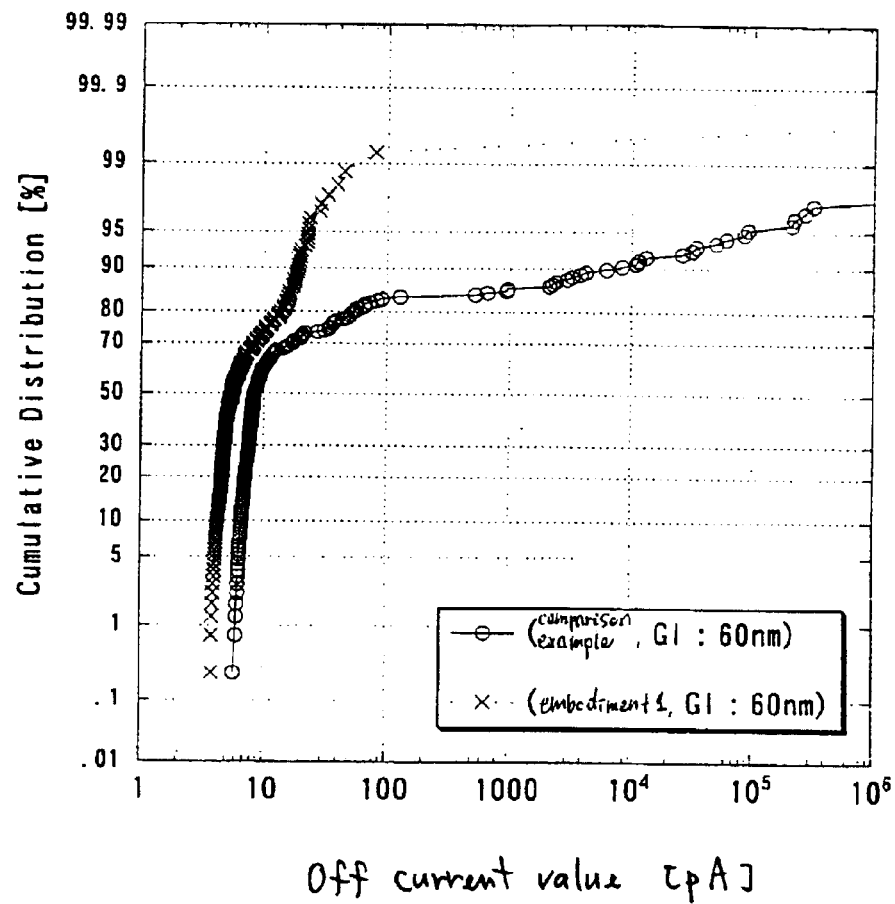
FIG. 15 is a graph showing an off-current value in a TFT (a gate insulating film with a thickness of 60 nm) with L/W=7/40.

Further, FIGS. 12 to 15 show the measurement results of distribution of probability statistics of an off-current value with Vd=5 V and Vg=−4.5 V. Note that, in the figures, the distribution of probability statistics in this embodiment is plotted with "X" and the distribution of probability statistics in the comparison example, in which only the first laser light irradiation is conducted, is plotted with "O". The vertical axis in FIGS. 12 to 15 indicates percentage, and the value at 50% corresponds to the average value of an off current. Further, the horizontal axis indicates an off-current value. For example, if fluctuation is large, the region occupied by all the plots, namely, the horizontal width, becomes large. In the case where leveling is performed with the second laser light, the reduction in fluctuation of the off-current value is seen more remarkably as the thickness of the gate insulating film becomes thinner. Further, in the case where leveling is performed with the second laser light, the reduction in fluctuation of the off-current value is seen more remarkably in the TFT with channel length L/channel width W=7 μm/40 μm which is shown in FIG. 15 in comparison with the TFTs with L/W=2 μm/8 μm which are shown in FIGS. 12 to 14. Therefore, in the case where leveling is performed with the second laser light, fluctuation can be effectively suppressed in the TFT having a relatively large channel width, for example, the TFT used in a buffer circuit (L/W=7 μm/140 μm, 7 μm/270 μm, 7 μm/400 μm, 7 μm/800 μm, and the like) or the TFT used in an analog switch circuit (L/W=8 μm/400 μm).

From the above, by improving the flatness of the semiconductor film surface, even if the thickness of the gate insulating film is thinned, fluctuation of the off current is reduced, and the yield of the TFT is enhanced. In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved characteristics and to have sufficient reliability.

Note that, in the pixel TFT of the pixel portion 207 as well, the second laser light irradiation enables the reduction in off current and the reduction in fluctuation.

Further, an example of manufacturing the active matrix substrate for forming a reflection type display device is shown in this embodiment. However, if the pixel electrode is formed of a transparent conductive film, a transmission type display device can be formed although the number of photomasks is increased by one.

Furthermore, this embodiment can be freely combined with any of Embodiment Modes 1 to 3.

Embodiment 2

In this embodiment, an example is shown in which a film deposition temperature of a base insulating film and a film deposition temperature of a semiconductor film having an amorphous structure are made equal to each other in Embodiment 1.

A glass substrate (#1737) is used as a substrate. As a base insulating film, a silicon oxynitride film formed from $SiH_4$, $NH_3$ and $N_2O$ as material gases (composition ratio: Si=32%, O=27%, N=24%, H=17%) is formed with a thickness of 50 nm (preferably 10 to 200 nm) and at a film deposition temperature of 300° C. by using plasma CVD. Next, the surface of the base insulating film is cleaned with ozone water, and then, the oxide film on the surface is removed with dilute hydrofluoric acid (1/100 dilution). Subsequently, a silicon hydride oxynitride film formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 300° C. by using plasma CVD to form a lamination. Further, without exposure to an atmosphere, a semiconductor film having an amorphous structure (here, amorphous silicon film) is formed from $SiH_4$ as a film deposition gas to have a thickness of 54 nm (preferably 25 to 80 nm) at a film deposition temperature of 300° C. by using plasma CVD.

As described above, the film deposition temperature of the base insulating film and the film deposition temperature for forming the amorphous semiconductor film are substantially made the same, and set to 300° C. in this embodiment. Thus, the amorphous semiconductor film having a surface which has no minute convex portion and which is excellent in flatness can be obtained on the base insulating film. The occurrence of minute holes can be suppressed even with laser light irradiation in the later step. Further, the same effect can be obtained also when the film deposition temperature of the base insulating film and the film deposition temperature of the amorphous semiconductor film are set to 400° C.

Further, as in case of the second laser light shown in Embodiment 1, in the case where laser light is irradiated to a semiconductor film in a vacuum or in an inert gas atmosphere, minute holes are easy to be generated. Therefore, this embodiment is particularly effective.

The step of forming the semiconductor film having an amorphous structure and the subsequent steps are the same as those in Embodiment 1, and thus, detailed description therefor is omitted.

If the semiconductor film having high flatness obtained in this embodiment is used in an active layer of a TFT, the withstand voltage is raised. Thus, the reliability of the TFT is further improved.

Further, this embodiment can be freely combined with any of Embodiment 1 and Embodiment Modes 1 to 3.

Embodiment 3

This embodiment describes a process of manufacturing an active matrix liquid crystal display device from the active matrix substrate fabricated in Embodiments 1 or 2. The description is given with reference to FIG. 16.

Figure 7:
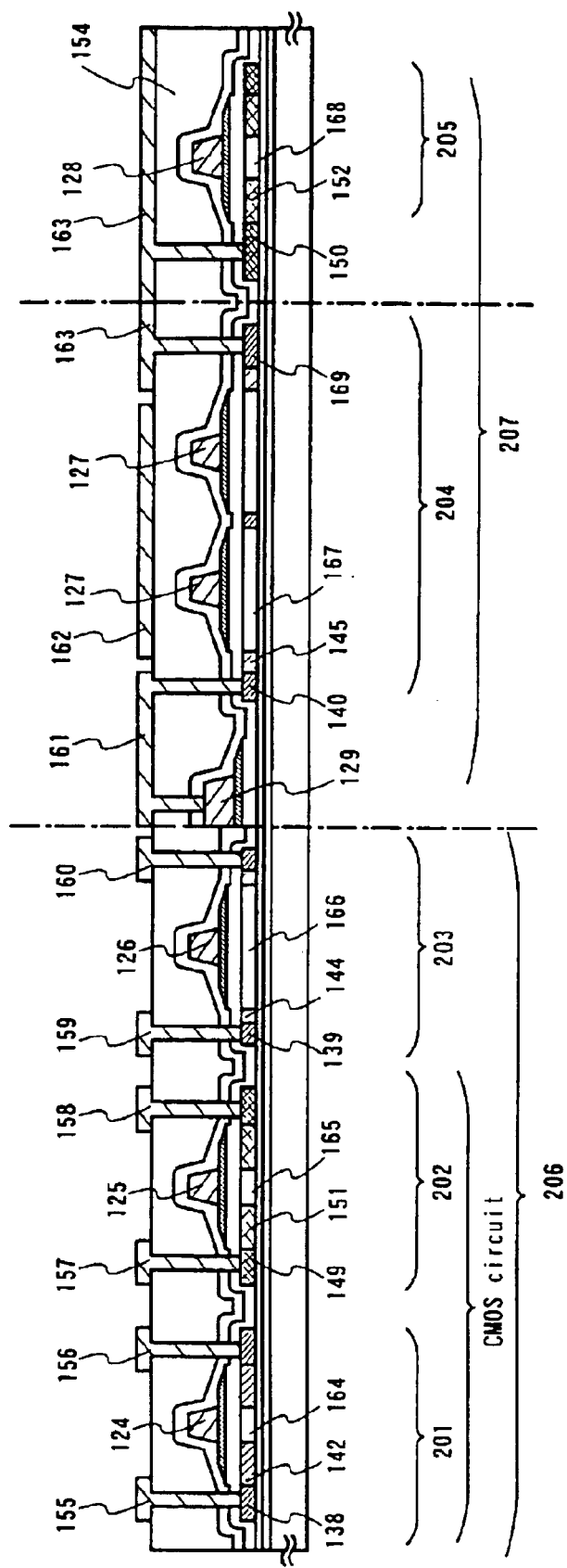
FIG. 7 is a view of the active matrix substrate.

After the active matrix substrate as illustrated in FIG. 7 is obtained in accordance with Embodiment 1, an oriented film is formed on the active matrix substrate of FIG. 7 and subjected to rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 16:
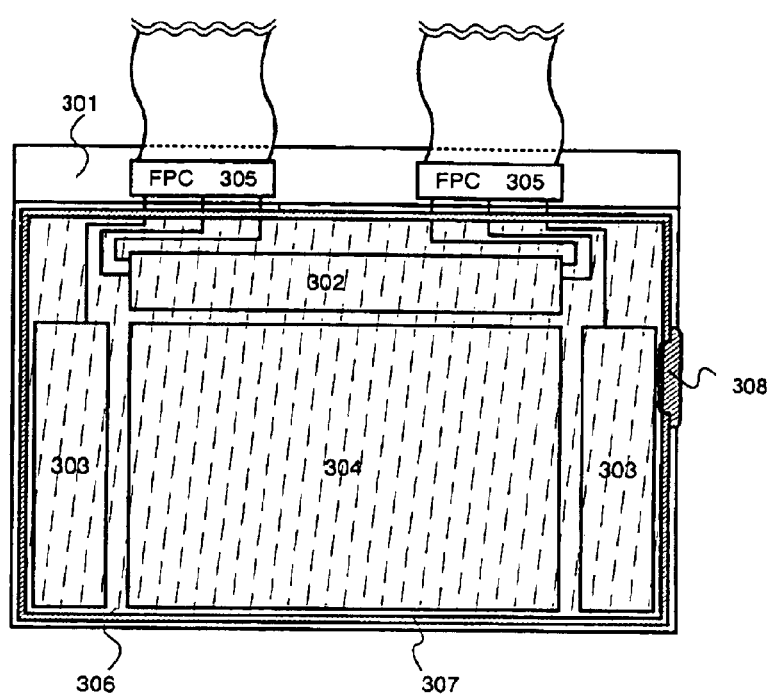
FIG. 16 is a view of an outer appearance of an AM-LCD

The structure of the thus obtained liquid crystal module is described with reference to the top view in FIG. 16.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 16 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode 309 so as to reach the wiring lines arranged in given places of the substrate 301. The connection electrode is formed from ITO in this embodiment.

A sealing agent 307 is applied to the substrate along its perimeter surrounding the driving circuits and the pixel portion. An opposite substrate 306 is bonded to the substrate 301 by the sealing agent 307 while a spacer 310 formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Further, this embodiment can be freely combined with any structures in Embodiment Modes 1 to 3, Embodiment 1 and Embodiment 2.

Embodiment 4

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 17:
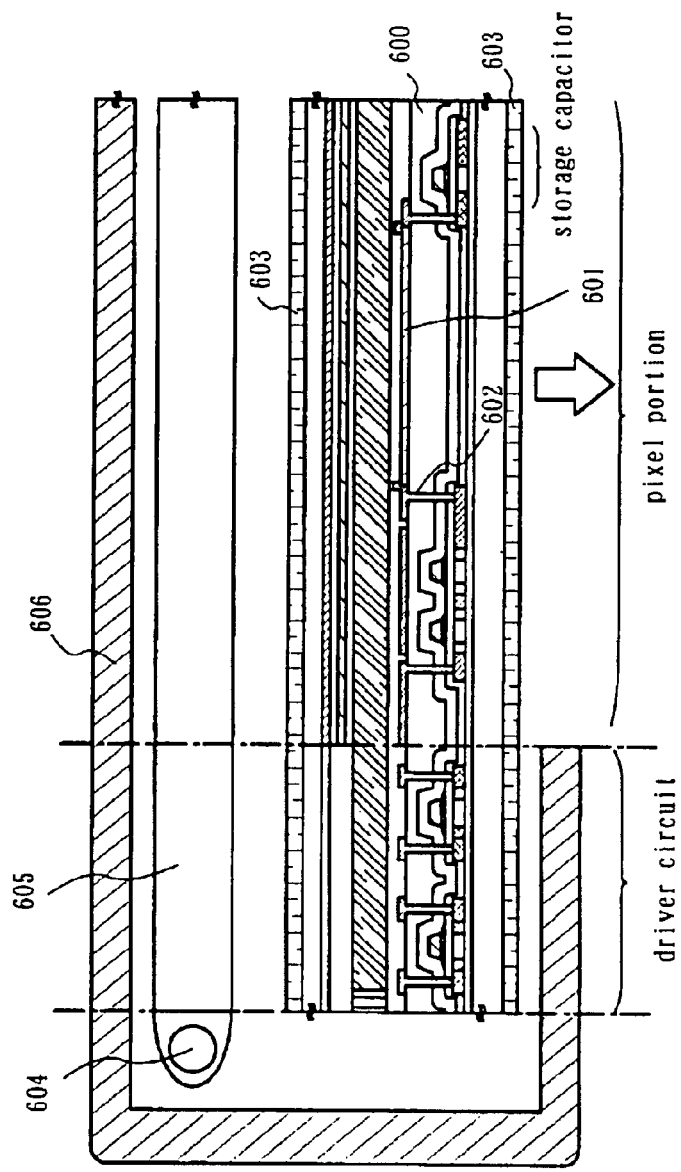
FIG. 17 is a view of one example of a sectional view of a liquid crystal display device (Embodiment 4)

An active matrix substrate is completed as above. A liquid crystal module is manufactured from this active matrix substrate in accordance with Embodiment 3. The liquid crystal module is provided with a backlight 604 and a light guiding plate 605, and is covered with a cover 606 to complete the active matrix liquid crystal display device of which a partial sectional view is shown in FIG. 17. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This embodiment can be freely combined with any structures in Embodiment Modes 1 to 3, and Embodiments 1 to 3.

Embodiment 5

Figure 18A:
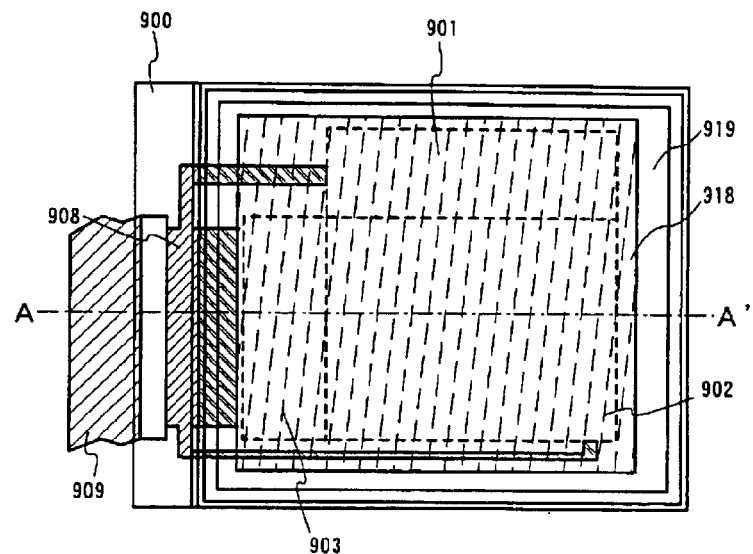
FIGS. 18A and 18B are a top view and a sectional view of an EL module (Embodiment 5)
Figure 18B:
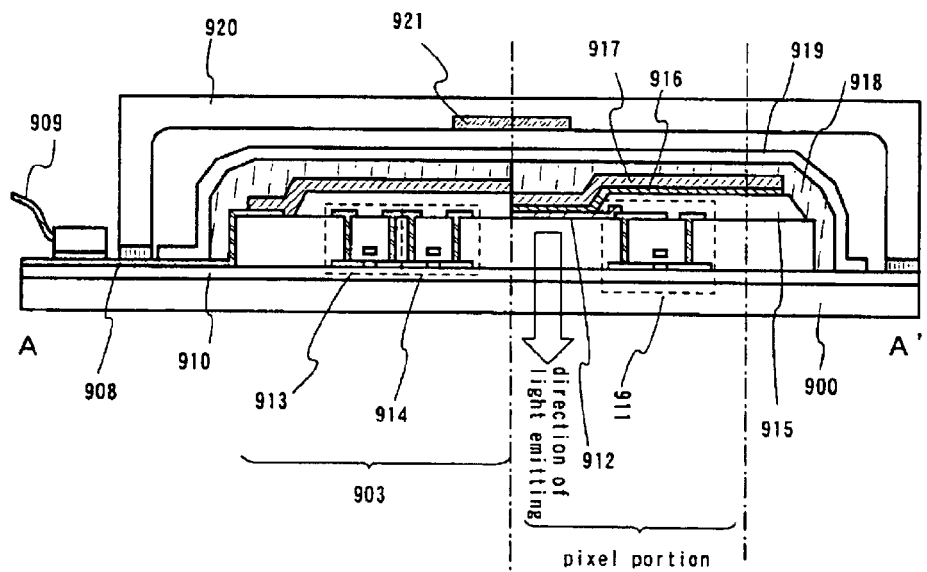

In this embodiment, an example of manufacturing a light emitting display device provided with an EL (electro luminescence) element is shown in FIGS. 18A and 18B.

FIG. 18A is a top view of an EL module, and FIG. 18B is a sectional view taken along a line A–A' of FIG. 18A. On a substrate 900 having an insulating surface (for example, a glass substrate, a crystallized glass substrate, a plastic substrate or the like), a pixel portion 902, a source side driver circuit 901, and a gate side driver circuit 903 are formed. The pixel portion and the driver circuits can be obtained in accordance with the above-described embodiments. Further, reference numeral 918 indicates a sealing member, and reference numeral 919 indicates a DLC film. The pixel portion and the driver circuit portions are covered by the sealing member 918, and the sealing member is covered by a protective film 919. Further, the protective film 919 is sealed by a cover member 920 using an adhesive. It is desirable that the cover member 920 is made of the same material as the substrate 900, for example, is a glass substrate in order to withstand deformation due to heat or external force. The cover member 920 is processed to have the convex shape (with a depth of 3 to 10 $\mu$m) shown in FIG. 18B by sandblasting or the like. It is desirable that the cover member 920 is further processed to form a convex portion (with a depth of 50 to 200 $\mu$m) into which a drying agent 921 can be arranged. Further, in the case where multiple EL modules are manufactured, after the substrate and the cover member are attached with each other, segmentation may be conducted using a $CO_2$ laser or the like such that end surfaces match with each other.

Note that reference numeral 908 indicates a wiring for transmitting signals input to the source side driver circuit 901 and the gate side driver circuit 903, and receives a video signal and a clock signal from an FPC (flexible printed circuit) 909 that is an external input terminal. Note that although only the FPC is shown in the figure, a printed wiring board (PWB) may be attached to the FPC. The light emitting device in this specification includes not only the main body of the light emitting device but also the light emitting device attached with the FPC or PWB.

Next, the sectional structure is described with reference to FIG. 18B. An insulating film 910 is provided on the substrate 900, the pixel portion 902 and the gate side driver circuit 903 are formed above the insulating film 910, and the pixel portion 902 is constituted of a plurality of pixels including a current control TFT 911 and a pixel electrode 912 electrically connected to a drain of the current control TFT 911. Further, the gate side driver circuit 903 is formed by using a CMOS circuit in which an n-channel TFT 913 and a p-channel TFT 914 are combined.

The above TFTs (including 911, 913, and 914) may be manufactured in accordance with the n-channel TFT 201 and the p-channel TFT 202 in Embodiment 1.

Note that, as to a material of the insulating film provided between the TFT and the EL element, it is appropriate to use a material that not only blocks diffusion of impurity ions such as alkali metal ions or alkaline-earth metal ions but also positively adsorbs the impurity ions such as alkali metal ions or alkaline-earth metal ions, and further to use a material that can withstand a subsequent process temperature. As the material that satisfies the above conditions, a silicon nitride film containing a large amount of fluorine is given as an example. The concentration of fluorine contained in the silicon nitride film is $1 \times 10^{19}/cm^3$ or more, and preferably, the composition ratio of fluorine in the silicon nitride film is 1 to 5%. Fluorine in the silicon nitride film bonds to alkali metal ions or alkaline-earth metal ions, and is adsorbed into the film. Further, as another example, there is given an organic resin film containing particulates comprised of a stibium (Sb) compound, a stannum (Sn) compound or an indium (In) compound, which adsorbs alkali metal ions, alkaline-earth metal ions or the like, for example, an organic resin film containing particulates of stibium pentoxide ($Sb_2O_5 \cdot nH_2O$). Note that this organic resin film contains particulates with an average particle size of 10 to 20 nm, and has high light transmission properties. The stibium compound typified by the stibium pentoxide particulates is likely to adsorb impurity ions such as alkali metal ions or alkaline-earth metal ions.

The pixel electrode 912 functions as an anode of a light emitting element (EL element). Further, banks 915 are formed at both ends of the pixel electrode 912, and an EL layer 916 and a cathode 917 of the light emitting element are formed on the pixel electrode 912.

As to the EL layer 916, a light emitting layer, a charge transportation layer and a charge injection layer may be freely combined to form an EL layer (layer for light emission and movement of carrier for light emission). For example, a low molecular weight organic EL material or a high molecular weight Organic EL material may be used. Further, as the EL layer, a thin film formed from a light emitting material that emits light by singlet excitation (fluorescence) (singlet compound) or a thin film formed from a light emitting material that emits light by triplet excitation (phosphorescence) (triplet compound) can be used. Further, an inorganic material such as silicon carbide can be used for the charge transportation layer or the charge injection layer. Known materials can be used for the organic EL materials or inorganic materials.

A cathode 927 also functions as a wiring common to all the pixels, and is electrically connected to the FPC 909 through the connection wiring 908. Further, all the elements contained in the pixel portion 902 and the gate side driver circuit 903 are covered by the cathode 917, the sealing member 918 and the protective film 919.

Note that a material that is transparent or semitransparent to visible light is preferably used for the sealing member 918. Further, the sealing member 918 is desirably formed from a material that does not permeate moisture or oxygen as much as possible.

Further, after the light emitting element is completely covered by the sealing member 918, it is preferable that the protective film 919 comprised of a DLC film or the like is provided at least on the surface (exposed surface) of the sealing member 918 as shown in FIGS. 18A and 18B. Further, the protective film may be provided on the entire surface including the back surface of the substrate. Here, it is necessary that attention is paid to in order that the protective film is not deposited to the portion where the external input terminal (FPC) is provided. A mask may be used in order not to form the protective film. Alternatively, the external input terminal portion may be covered by a tape formed of Teflon (registered trademark) or the like, which is used as a masking tape in a CVD apparatus in order not to form the protective film.

The light emitting element is sealed by the sealing member 918 and the protective film with the above-described structure, whereby the light emitting element can be completely shut from the outside. Thus, it is possible to prevent a substance that promotes deterioration due to oxidization of the EL layer, such as moisture or oxygen from permeating from the outside. Therefore, the light emitting device with high reliability can be obtained.

Figure 19:
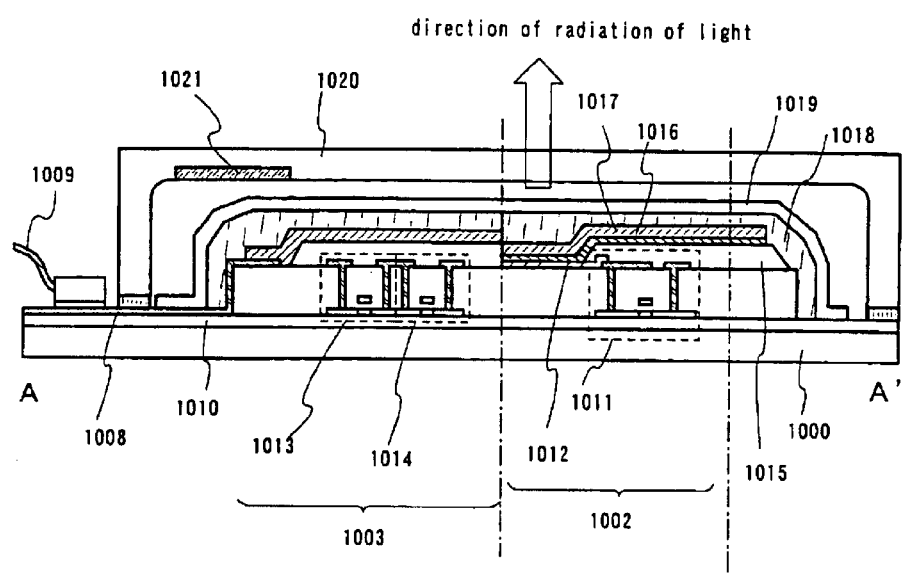
FIG. 19 is a sectional view of the EL module (Embodiment 5)

Further, the structure may be adopted in which a pixel electrode is a cathode, and an EL layer and an anode are laminated to thereby provide light emission in an opposite direction to that in FIGS. 18A and 18B. FIG. 19 shows an example thereof. Note that a top view of the example is the same as that of FIG. 18A, and thus is omitted.

A sectional structure shown in FIG. 19 is described below. As a substrate 1000, a semiconductor substrate or a metal substrate can be used besides a glass substrate and a quartz substrate. An insulating film 1010 is provided on the substrate 1000, a pixel portion 1002 and a gate side driver circuit 1003 are formed above the insulating film 1010, the pixel portion 1002 is constituted of a plurality of pixels including a current control TFT 1011 and a pixel electrode 1012 electrically connected to a drain of the current control TFT 1011. Further, the gate side driver circuit 1003 is formed by using a CMOS circuit in which an n-channel TFT 1013 and a p-channel TFF 1014 are combined.

The pixel electrode 1012 functions as a cathode of a light emitting element. Further, banks 1015 are formed at both ends of the pixel electrode 1012, and an EL layer 1016 and an anode 1017 of the light emitting element are formed on the pixel electrode 1012.

The anode 1017 also functions as a wiring common to all the pixels, and is electrically connected to an FPC 1009 via a connection wiring 1008. Further, all the elements contained in the pixel portion 1002 and the gate side driver circuit 1003 are covered by the anode 1017, a sealing member 1018 and a protective film 1019 comprised of a DLC film or the like. Further, a cover member 1020 and the substrate 1000 are bonded by an adhesive. In addition, a concave portion is provided in the cover member, and a drying agent 1021 is arranged therein.

Note that a material that is transparent or semitransparent to visible light is preferably used for the sealing member 1018. Further, the sealing member 1018 is desirably formed from a material that does not permeate moisture and oxygen as much as possible.

Further, in FIG. 19, the pixel electrode is the cathode, and the EL layer and the anode are laminated. Thus, the light emission direction is indicated by an arrow in FIG. 19.

In this embodiment, the TFT with high electrical characteristics and high reliability which is obtained in Embodiment 1 is used, and therefore, there can be formed a light emitting element with higher reliability compared with a conventional element. Further, a light emitting device having such a light emitting element is used as a display portion. Thus, an electric equipment with high performance can be obtained.

Note that this embodiment can be freely combined with any of Embodiment Modes 1 to 3, Embodiment 1 and Embodiment 2.

Embodiment 6

In Embodiment 1, an example of a top gate type TFT is shown. However, the present invention can be applied without limitation on the TFT structure. In this embodiment, FIG. 20 shows an example in which the present invention is applied to a TFT in which two gate electrodes are provided sandwiching a semiconductor layer.

First, a first gate wiring 1101 is provided on a substrate 1100. Poly-Si or $WSi_X$ (X=2.0 to 2.8) doped with an impurity element imparting conductivity, a conductive material such as Al, Ta, W, Cr or Mo or a lamination structure thereof can be used for the first gate wiring 1101. Note that in order to prevent diffusion of impurities from the substrate 1100, a base insulating film comprised of an insulating film such as a silicon oxide film, a silicon nitride film or a silicon oxynitride film may be formed.

Next, a first insulating film 1102 with a thickness of approximately 500 nm is formed so as to cover the first gate wiring 1101. As the first insulating film 1102, an insulating film containing silicon, which is formed by plasma CVD or sputtering, is used. Further, the first insulating film may be formed of an organic insulating material film, a silicon oxide film, a silicon oxynitride film, a silicon nitride film, or a lamination film in which the above films are combined.

Then, a second insulating film 1103 and a semiconductor film having an amorphous structure, an amorphous silicon film here, are formed in lamination at the same film deposition temperature by using plasma CVD in accordance with any one of Embodiment Modes 1 to 3. The amorphous semiconductor film having a surface which has no minute convex portion and which is excellent in flatness can be obtained on the second insulating film 1103. The occurrence of minute holes can be suppressed even with laser light irradiation in the late step.

Further, in this embodiment, the example is shown in which the film deposition temperature is set to the same between the second insulating film 1103 and the semiconductor film having an amorphous structure. However, the film deposition temperature may be made the same among the first insulating film 1102, the second insulating film 1103 and the semiconductor film having an amorphous structure. Note that the base insulating film to the semiconductor film corresponds to the first insulating film and the second insulating film in this embodiment.

Then, the semiconductor film having an amorphous structure is crystallized by using the crystallization technique described in Embodiment Mode 1 or Embodiment 1 to form a crystalline silicon film (poly-Si), and then, the film is patterned to have an island-shape. In this embodiment, the crystallization technique in Embodiment 1 is used, and further, second laser light irradiation for the leveling of the surface of the semiconductor film, which is shown in Embodiment 1, is performed in a nitrogen atmosphere or in a vacuum. The semiconductor film having high flatness thus obtained is used in an active layer of a TFT, whereby the withstand voltage of the TFT is raised. Thus, the reliability of the TFT is improved.

Subsequently, after a gate insulating film 1107 is formed so as to cover the semiconductor layer, a second gate electrode 1108 is formed. Then, an impurity element imparting n-type conductivity (P, As, or the like), in this case phosphorous, is appropriately added to the semiconductor to form a source region 1104 and a drain region 1105. After the addition, a heating treatment, irradiation of a strong light, or irradiation of a laser light is performed for activation of the impurity element.

Figure 20A:
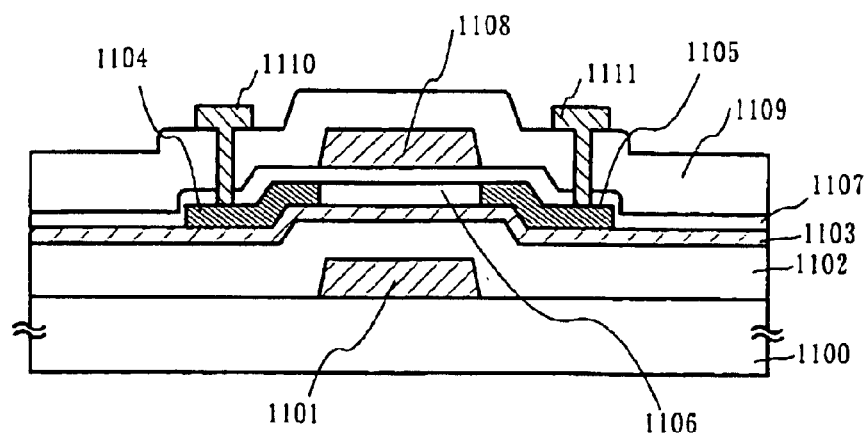
FIGS. 20A and 20B are views of examples of TFTs (Embodiment 6)

As to the subsequent steps, an interlayer insulating film 1109 is formed, hydrogenation is conducted, contact holes that respectively reach the source region and the drain region, a contact hole that reaches the first gate electrode, and a contact hole that reaches the second gate electrode are formed, and a source electrode 1110 and a drain electrode 1111 are formed, thereby completing a TFT (n-channel TFT). The TFT thus obtained is shown in FIG. 20A. Note that reference numeral 1106 indicates a channel forming region in FIG. 20A.

Further, according to the structure in this embodiment, the TFT of each pixel may employ a dual gate structure in which gate electrodes are respectively provided above and below the channel forming region 1106 through the insulating films. The first insulating film and the second insulating film each are set to have an appropriate thickness, whereby the TFT characteristics can be improved while a parasitic capacitance formed by the first gate electrode and other wiring is suppressed. In addition, since the structure in this embodiment adopts the dual gate structure, an S value indicates an excellent value.

Further, as shown in FIG. 20A, in the above step, the semiconductor layer is influenced by the first gate electrode, whereby steps are formed.

Figure 20B:
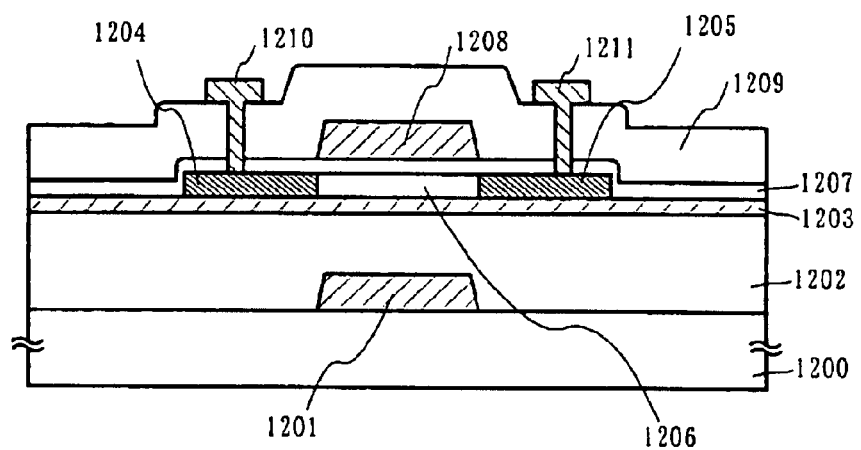

When leveling is performed using a CMP (chemical mechanical polishing) technique or the like for the purpose of eliminating the steps, the TFT structure shown in FIG. 20B can be obtained.

First, a first gate electrode 1201 is formed on a substrate 1200 for forming a first insulating film. Next, the surface of the first insulating film is polished by CMP or mechanical polishing to form the flat first insulating film 1202. For example, the maximum height (Rmax) of the surface of the first insulating film is set to 0.5 $\mu$m or less, preferably 0.3 $\mu$m or less.

Since a slurry or the like is used in CMP, impurities are easy to be mixed. Thus, a second insulating film 1203 is further formed. The second insulating film 1203 is provided to prevent the impurities from diffusing to a semiconductor layer to be formed later. In this embodiment, the second insulating film 1203 and a semiconductor film having an amorphous structure, an amorphous silicon film here, are used to form a lamination at the same film deposition temperature by using plasma CVD in accordance with any one of Embodiment Modes 1 to 3. The amorphous semiconductor film having a surface which has no minute convex portion and which is excellent in flatness can be obtained on the second insulating film 1203. Thus, the occurrence of minute holes can be suppressed even when a laser light is irradiated in the later step.

Further, the example is shown in the film deposition temperature is set to the same between the second insulating film 1203 and the semiconductor film having an amorphous structure. However, the film deposition temperature may be made the same among the first insulating film 1202, the second insulating film 1203 and the semiconductor film having an amorphous structure. Note that the base insulating film to the semiconductor film corresponds to the first insulating film and the second insulating film in this embodiment.

Next, the semiconductor film having an amorphous structure is crystallized by using the crystallization technique described in Embodiment Mode 1 or Embodiment 1 to form a crystalline silicon film (poly-Si), and patterning is conducted to the film to have an island-shape. In this embodiment, the crystallization technique in Embodiment 1 is used, and second laser light irradiation for the leveling of the semiconductor film surface, which is shown in Embodiment 1, is performed in a nitrogen atmosphere or in a vacuum. The semiconductor film having high flatness thus obtained is used in an active layer of a TFT, whereby the withstand voltage is raised. Thus, the reliability of the TFT is improved.

Subsequently, a gate insulating film 1207 is formed so as to cover the semiconductor layer, and then, a second gate electrode 1208 is formed. Then, an impurity element imparting n-type conductivity (P, As, or the like), in this case phosphorous, is appropriately added to the semiconductor to form a source region 1204 and a drain region 1205. After the addition, a heating treatment, irradiation of a strong light, or irradiation of a laser light is performed for activation of the impurity element.

As to the subsequent steps, an interlayer insulating film 1209 is formed, hydrogenation is performed, contact holes that respectively reach the source region and the drain region, a contact hole that reaches the first gate electrode, a contact hole that reaches the second gate electrode, and the like are formed, and a source electrode 1210, a drain electrode 1211, and the like are formed, thereby completing a TFT (n-channel TFT). The TFT thus obtained is shown in FIG. 20B. Note that reference numeral 1206 indicates a channel forming region in FIG. 20B.

In the structure of FIG. 20B, the step of leveling is added in comparison with the structure of FIG. 20A. However, the structure with the flatter semiconductor film surface can be realized.

Note that this embodiment can be freely combined with any of Embodiment Modes 1 to 3 and Embodiments 1 to 5.

Embodiment 7

Figure 21:
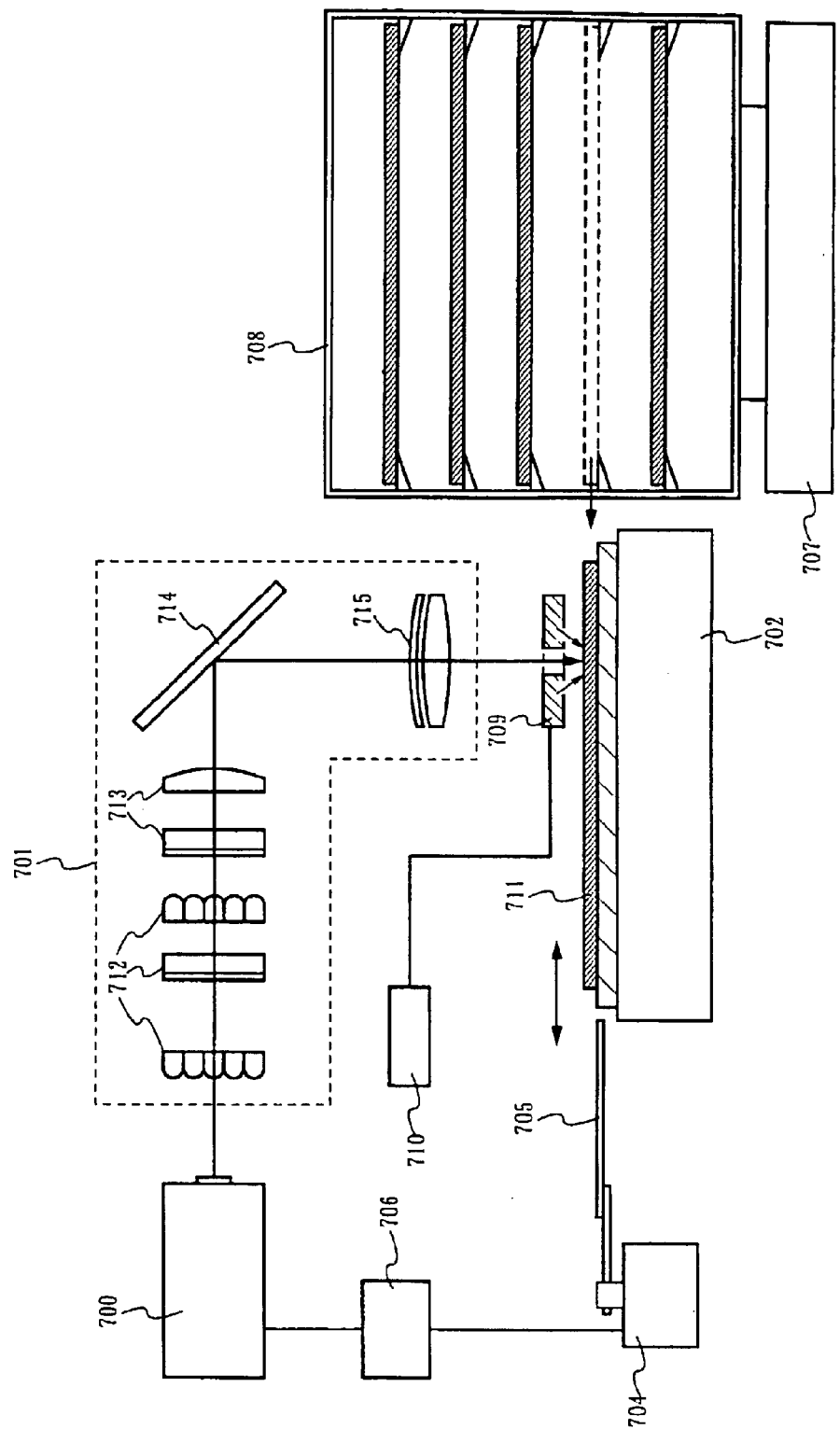
FIG. 21 is a view of a laser device (Embodiment 7)

FIG. 21 is a diagram showing an embodiment of a laser processing apparatus capable of being applied to the present invention. The apparatus is constituted of a laser 700, an optical system 701, a substrate stage 702, a substrate conveyor means 704, a blower 710, and the like. Further, a cassette 708 for holding a substrate 711, a cassette holder 707, a nozzle 709 that becomes a gas exhaust port for removing debris and the like on the substrate by a gas supplied from a blower, and the like are prepared as accessories. Note that gas emitted from the nozzle 709 is blown to regions in which laser light is irradiated. In addition, when the gas emitted from the nozzle 709 is heated, the substrate is also possible to be heated.

A gaseous state laser such as an excimer laser that emits light at a wavelength equal to or less than 400 nm, or a solid state laser such as an Nd-YAG laser or a YLF laser is used as the laser. In addition to the fundamental harmonic (1060 nm), harmonics such as the second harmonic (532 nm) or the third harmonic (353.3 nm) can be used with the Nd-YAG laser. These lasers are pulse emission lasers, and an emission frequency on the order of 5 to 300 Hz is employed.

The optical system 701 is a system for condensing and expanding laser light emitted from the laser 700, and irradiating laser light having a fine line shape cross section to a surface to be irradiated. The structure of the optical system 710 may be arbitrary, and it is structured here using components such as a cylindrical lens array 712, a cylindrical lens 713, a mirror 714, and a doublet cylindrical lens 715. Although depending upon the size of the lenses, it is possible to irradiate linear shape laser light having a length in the longitudinal direction on the order of 100 to 400 mm, and a length in the width direction on the order of 100 to 500 μm.

The stage 702 maintains the substrate 711 for processing, and moves in synchronous with the laser.

Removal of the substrate 711 from the cassette 708 and the movement thereof accompanied with laser processing is performed by the conveyor means 704. An arm 705 is prepared in the conveyor means 704. It becomes possible to irradiate the linear shape laser light over the entire substrate in accordance with the arm 705 grasping one end of the substrate 711 and moving in an axial direction. The conveyor means 704 operates in concert with emission of the laser 700 in accordance with a control device 706.

Further, a conveyor means capable of moving the substrate in a direction normal to the axial direction is prepared for cases in which a side of the substrate 711 has a larger length than the linear laser light in the longitudinal direction (not shown in the figures). It becomes possible to irradiate the laser light over the entire substrate surface by using the two conveyor means capable of moving the substrate in mutually perpendicular directions.

This type of laser apparatus is particularly effective for cases of processing glass substrate having an edge length exceeding 1000 mm and a thickness equal to or less than 1 mm. For example, a glass substrate which is 1200 mm×160 mm or 2000 mm×2500 mm and has a thickness of 0.4 to 0.7 mm can be processed.

Further, it is possible to freely combine Embodiment 7 with any one of Embodiment Modes 1 to 3, and Embodiments 1 to 6. For example, it is possible to apply Embodiment 7 to the first laser light irradiation of Embodiment 1. At this time, air, or a gas containing oxygen, blown out from the nozzle may be blown out to regions at which the laser light is irradiated. Furthermore, it is possible to apply Embodiment 7 to the second laser light irradiation of Embodiment 1. In this case, an inert gas, for example nitrogen, is used as the gas emitted from the nozzle, and is blown out to the regions at which the laser light is irradiated, thereby performing leveling of the semiconductor film surface. It is therefore not necessary to replace the atmosphere within a processing chamber for laser light irradiation in cases where Embodiment 7 is combined with Embodiment 1. Irradiation of the first laser light and irradiation of the second laser light can be performed in a short amount of time by appropriately switching the gas blown out from the nozzle.

Embodiment 8

The driver circuit and the pixel portion formed by implementing the present invention can be used in various modules (active matrix type liquid crystal module, active matrix type EL module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 22, 23 and 24.

FIG. 22A shows a personal computer including a main body 2001, an image input portion 2002, a display portion 2003 and a keyboard 2004. The present invention can be applied to the display portion 2003.

FIG. 22B shows a video camera including a main body 2101, a display portion 2102, a voice input portion 2103, operation switches 2104, a battery 2105 and an image receiving portion 2106. The present invention can be applied to the display portion 2102.

FIG. 22C shows a mobile computer including a main body 2201, a camera portion 2202, an image receiving portion 2203, an operation switch 2204 and a display portion 2205. The present invention can be applied to the display portion 2205.

FIG. 22D shows a goggle type display including a main body 2301, a display portion 2302 and an arm portion 2303. The present invention can be applied to the display portion 2302.

FIG. 22E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet. The present invention can be applied to the display portion 2402.

FIG. 22F shows a digital camera including a main body 2501, a display portion 2502, an eye contact portion 2503, operation switches 2504 and an image receiving portion (not illustrated). The present invention can be applied to the display portion 2502.

Figure 23A:
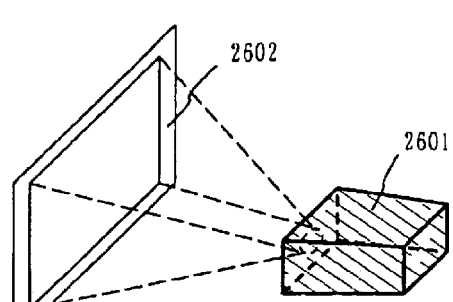
FIGS. 23A to 23D show examples of electronic equipment.

FIG. 23A shows a front type projector including a projection equipment 2601 and a screen 2602. The present invention can be applied to the liquid crystal module 2808 forming a part of the projection equipment 2601.

Figure 23B:
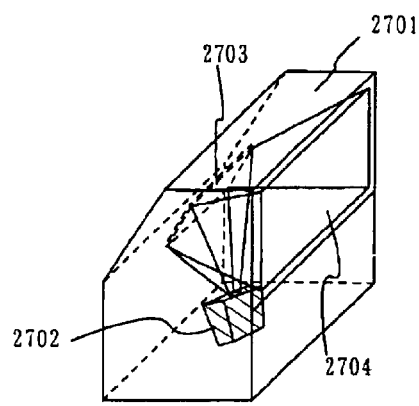

FIG. 23B shows a rear type projector including a main body 2701, a projection equipment 2702, a mirror 2703 and a screen 2704. The present invention can be applied to the liquid crystal module 2808 forming a part of the projection equipment 2702.

Figure 23C:
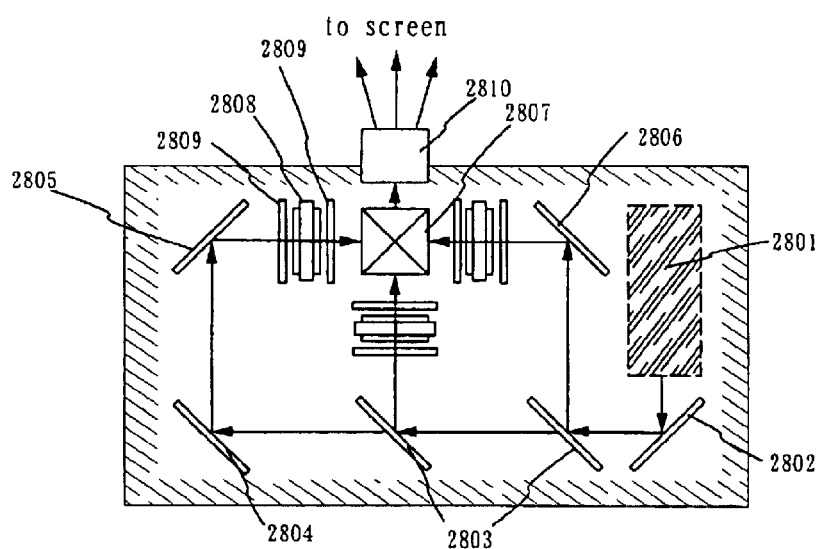

Further, FIG. 23C is a view showing an example of a structure of the projection equipment 2601 and 2702 in FIG. 23A and FIG. 23B. The projection equipment 2601 or 2702 is constituted by a light source optical system 2801, mirrors 2802, and 2804 through 2806, a dichroic mirror 2803, a prism 2807, a liquid crystal display equipment 2808, a phase difference plate 2809 and a projection optical system 2810. The projection optical system 2810 is constituted by an optical system including a projection lens. Although this embodiment shows an example of three plates type, this embodiment is not particularly limited thereto but may be of, for example, a single plate type. Further, person of executing this embodiment may pertinently provide an optical system such as an optical lens, a film having a polarization function, a film for adjusting a phase difference or an IR film in an optical path shown by arrow marks in FIG. 23C.

Figure 23D:
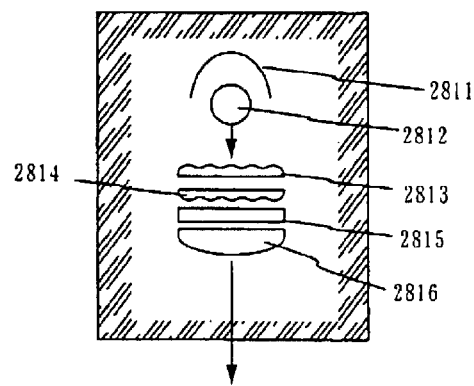

Further, FIG. 23D is a view showing an example of a structure of the light source optical system 2801 in FIG. 23C. According to this embodiment, the light source optical system 2801 is constituted by a reflector 2811, a light source 2812, lens arrays 2813 and 2814, a polarization conversion element 2815 and a focusing lens 2816. Further, the light source optical system shown in FIG. 23D is only an example and this example is not particularly limited thereto. For example, a person of executing this embodiment may pertinently provide an optical system such as an optical lens, a film having a polarization function, a film for adjusting a phase difference or an IR film in the light source optical system.

However, according to the projectors shown in FIG. 23, there is shown a case of using a transmission type electro-optical device and an example of applying a reflection type electro-optical device and EL module are not illustrated.

Figure 24A:
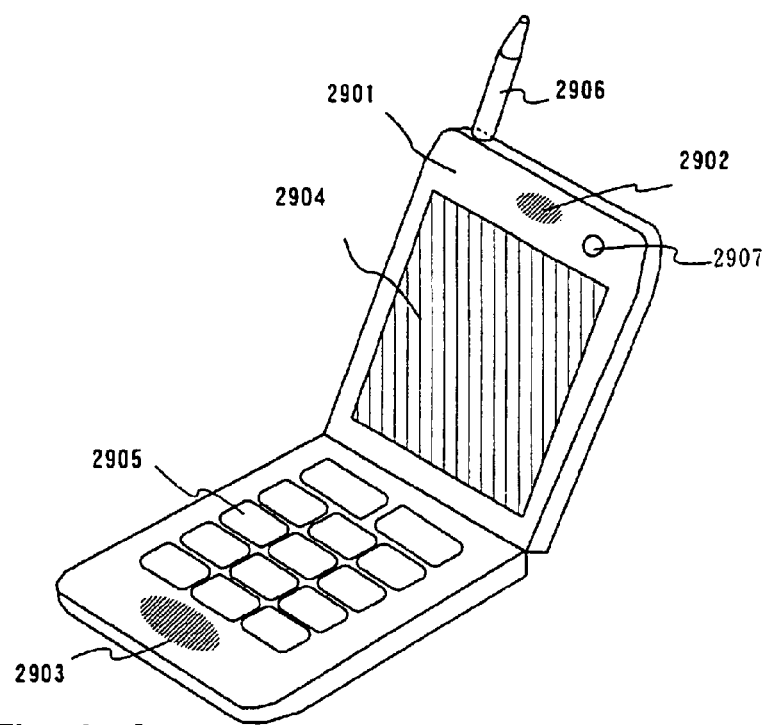
FIGS. 24A to 24C show examples of electronic equipment.

FIG. 24A shows a cellular phone including a main body 2901, a sound output portion 2902, a sound input portion 2903, a display portion 2904, an operation switch 2905, an antenna 2906 and an image input portion (CCD, image sensor or the like) 2907. The present invention can be applied to display portion 2904.

Figure 24B:
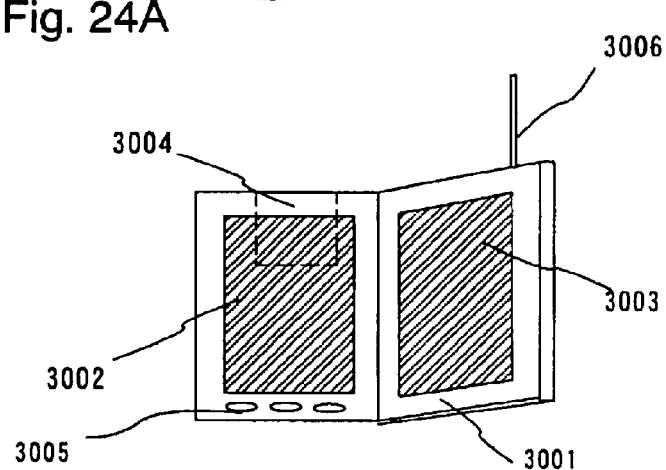

FIG. 24B shows a portable book (electronic book) including a main body 3001, display portions 3002 and 3003, a record medium 3004, an operation switch 3005 and an antenna 3006. The present invention can be applied to display portions 3002 and 3003.

Figure 24C:
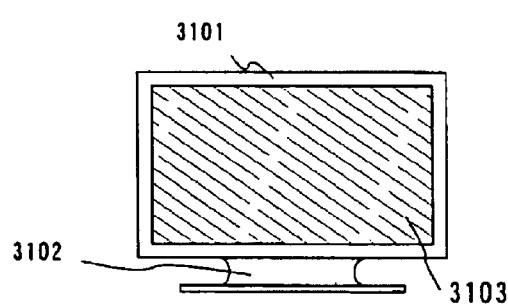

FIG. 24C shows a display including a main body 3101, a support base 3102 and a display portion 3103. The present invention can be applied to display portion 3103.

In addition, the display shown in FIG. 24C is small and medium type or large type, for example, screen of the display sized 5 to 20 inches. Moreover, it is preferable to mass-produce by executing a multiple pattern using a substrate sized 1×μm to form such sized display section.

As has been described, the range of applying the present invention is extremely wide and is applicable to electronic equipment of all the fields. The electronic equipment of the present invention can be implemented by freely combined with the structures in Embodiments 1 to 7.

Figure 25:
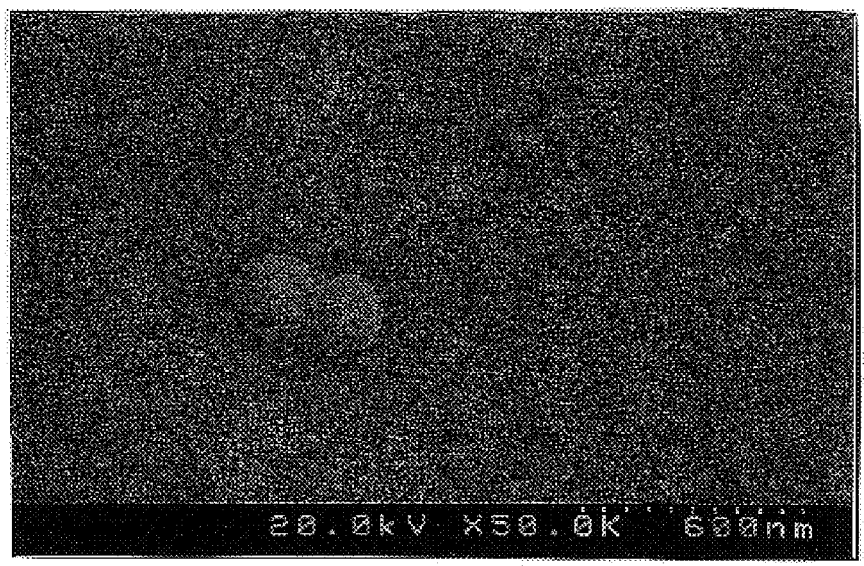
FIG. 25 is a photograph of a minute convex portion in observation with SEM (magnification of 50 thousand)
Figure 26:
FIG. 26 is a photograph of a minute hole in observation with SEM (magnification of 35 thousand).

According to the present invention, the amorphous semiconductor film having a surface which has no minute convex portion, which is as shown in FIG. 26, and which is excellent in flatness can be obtained on the base insulating film, and the occurrence of a minute hole, which is shown in FIG. 25, can be suppressed even with the laser light irradiation.

Further, also in the case where laser light irradiation is performed to the semiconductor film in a vacuum or in an inert gas atmosphere, the occurrence of a minute hole, which is shown in FIG. 25, can be suppressed.

According to the present invention, the semiconductor film having high flatness is used in the active layer of the TFT, whereby the withstand voltage is raised. Thus, the reliability of the TFT is improved. In particular, the off-current value of the TFT can be reduced, and also, the fluctuation can be suppressed. Therefore, the operational characteristics of the semiconductor device using such a TFT can be improved, and low power consumption of the device can be realized.

What is claimed is:

1. A method of manufacturing a semiconductor device, comprising:
    forming a base insulating film on an insulating surface;
    forming an amorphous semiconductor film on the base insulating film;
    doping the amorphous semiconductor film with a metal element;
    performing heat treatment to the amorphous semiconductor film;
    irradiating the amorphous semiconductor film with a first laser light to form a semiconductor film having a crystalline structure and an oxide film thereon;
    removing the oxide film; and
    irradiating the semiconductor film having the crystalline structure with a second laser light in an inert gas atmosphere or in a vacuum to level the surface of the semiconductor film having the crystalline structure.

2. A method of manufacturing a semiconductor device according to claim 1, wherein the heat treatment is a heating process or a process of irradiating a strong light.

3. A method of manufacturing a semiconductor device according to claim 2, wherein the strong light is a light emitted from one selected from the group consisting of a halogen lamp, a metal halide lamp, a xenon-arc lamp, a carbon-arc lamp, a high-pressure sodium lamp and a high-pressure mercury lamp.

4. A method of manufacturing a semiconductor device according to claim 1, wherein the metal element is one or a plurality of elements selected from the group consisting of Fe, Ni, Co, Ru, Rh, Pd, Os, Ir, Pt, Cu and Au.

5. A method of manufacturing a semiconductor device according to claim 1, wherein each of the first and second laser lights is a laser light emitted from an excimer laser, a YAG laser, a $YVO_4$ laser or a YLF laser.

6. A method of manufacturing a semiconductor device according to claim 1, wherein the inert gas atmosphere is a nitrogen atmosphere.

7. A method of manufacturing a semiconductor device according to claim 1, wherein the second laser light is a continuous oscillation laser.

8. A method of manufacturing a semiconductor device, comprising:
    forming a base insulating film on an insulating surface;
    forming an amorphous semiconductor film on the base insulating film;
    doping the amorphous semiconductor film with a metal element;
    performing heat treatment to the amorphous semiconductor film;

irradiating the amorphous semiconductor film with a first laser light to form a semiconductor film having a crystalline structure and an oxide film thereon;

removing the oxide film; and irradiating the semiconductor film having the crystalline structure with a second laser light in an inert gas atmosphere or in a vacuum to level the surface of the semiconductor film having the crystalline structure, wherein the first laser light is a continuous oscillation laser.

9. A method of manufacturing a semiconductor device, comprising:

forming a base insulating film on an insulating surface;

forming an amorphous semiconductor film on the base insulating film;

doping the amorphous semiconductor film with a metal element;

performing heat treatment to the amorphous semiconductor film;

irradiating the amorphous semiconductor film with a first laser light to form a semiconductor film having a crystalline structure and an oxide film thereon;

removing the oxide film;

irradiating the semiconductor film having the crystalline structure with a second laser light in an inert gas atmosphere or in a vacuum to level the surface of the semiconductor film having the crystalline structure;

forming a semiconductor film comprising a noble gas element over the semiconductor film having the crystalline structure; and gettering the metal element to the semiconductor film comprising the noble gas element to reduce the metal element in the semiconductor film having the crystalline structure.

10. A method of manufacturing a semiconductor device, comprising:

forming a base insulating film on an insulating surface;

forming an amorphous semiconductor film on the base insulating film;

doping the amorphous semiconductor film with a metal element;

performing heat treatment to the amorphous semiconductor film;

irradiating the amorphous semiconductor film with a first laser light to form a semiconductor film having a crystalline structure and an oxide film thereon;

removing the oxide film;

irradiating the semiconductor film having the crystalline structure with a second laser light in an inert gas atmosphere or in a vacuum to level the surface of the semiconductor film having the crystalline structure, forming a barrier layer by oxidizing the surface of the semiconductor film having the crystalline structure;

forming a semiconductor film comprising a noble gas element on the barrier layer; and gettering the metal element to the semiconductor film comprising the noble gas element to reduce the metal element in the semiconductor film having the crystalline structure.

11. A method of manufacturing a semiconductor device, comprising:

forming a base insulating film on an insulating surface;

forming an amorphous semiconductor film on the base insulating film;

doping the amorphous semiconductor film with a metal element;

performing heat treatment to the amorphous semiconductor film;

irradiating the amorphous semiconductor film with a first laser light to form a semiconductor film having a crystalline structure and an oxide film thereon;

removing the oxide film;

irradiating the semiconductor film having the crystalline structure with a second laser light in an inert gas atmosphere or in a vacuum to level the surface of the semiconductor film having the crystalline structure;

patterning the semiconductor film having the crystalline structure;

forming a gate insulating film over the patterned semiconductor film having the crystalline structure;

forming a gate electrode over the gate insulating film.

* * * * *